United States Patent
Shiratake

[19]

[11] Patent Number: 6,147,514
[45] Date of Patent: Nov. 14, 2000

[54] SENSE AMPLIFIER CIRCUIT

[75] Inventor: Shinichiro Shiratake, Yokohama, Japan

[73] Assignee: Kabushiki Kaisha Toshiba, Kawasaki, Japan

[21] Appl. No.: 09/208,187

[22] Filed: Dec. 9, 1998

[30] Foreign Application Priority Data

Dec. 11, 1997 [JP] Japan ................................. 9-340972

[51] Int. Cl.$^7$ ................................................ G11C 7/06
[52] U.S. Cl. ................................................ 327/55; 327/57
[58] Field of Search ............................ 327/51–57, 333; 365/205, 207, 208

[56] References Cited

U.S. PATENT DOCUMENTS

| | | | |
|---|---|---|---|
| 4,697,112 | 9/1987 | Ohtani et al. | 327/55 |
| 5,355,391 | 10/1994 | Horowitz et al. | 375/36 |
| 5,465,060 | 11/1995 | Pelella | 327/57 |
| 5,526,314 | 6/1996 | Kumar | 327/57 |
| 5,726,942 | 3/1998 | Yoneda et al. | 327/57 |
| 5,854,562 | 12/1998 | Toyoshima et al. | 327/55 |

*Primary Examiner*—Toan Tran
*Attorney, Agent, or Firm*—Hogan & Hartson LLP

[57] ABSTRACT

This invention provides a sense amplifier circuit capable of determining an output with small power consumption at high speeds and simplifying a control signal. The sources of a pair of driver nMOS transistors in a first amplifier are connected to VSS via an activation nMOS transistor. An output from the first amplifier is directly input to input/output nodes of a second, latch amplifier. The sources of a pair of nMOS transistors in the second amplifier are connected to VSS via an activation nMOS transistor. The input/output nodes are precharged to VCC by a precharge circuit in a standby state. The activation nMOS transistors are simultaneously controlled by a clock signal, and the first and second amplifiers are simultaneously activated to sense, amplify, and latch the potential difference between input/output nodes.

14 Claims, 13 Drawing Sheets

SENSE AMPLIFIER CIRCUIT

BACKGROUND OF THE INVENTION

The present invention relates to a sense amplifier circuit for sensing/amplifying a small potential difference, which is useful as, e.g., a data line sense amplifier for a dynamic semiconductor memory device (DRAM).

A sense amplifier circuit for sensing a small potential difference between two electrodes or signal lines and outputting a signal corresponding to the relative potential magnitude of them is one of basic circuits used in various semiconductor devices. FIG. 22 shows an example of a bit line sense amplifier circuit used in a DRAM or the like. A CMOS transistor circuit having an inverter structure made up of an nMOS transistor QN1 and a pMOS transistor QP1, and a CMOS transistor circuit having an inverter structure made up of an nMOS transistor QN2 and a pMOS transistor QP2 are inverse-parallelly connected between input/output nodes Q and /Q, thereby constituting a latch (flip-flop) sense amplifier circuit. The common source between the nMOS transistors QN1 and QN2 is connected to a ground terminal VSS via an activation nMOS transistor QN3, whereas the common source between the PMOS transistors QP1 and QP2 is connected to a power supply terminal VCC via an activation pMOS transistor QP3.

FIG. 23 shows the operation waveform of this circuit. In an initial state, nodes SN and SP are kept at VCC/2, and the input nodes Q and /Q have a small potential difference. In this state, when one activation signal EN changes to "H", and the other activation signal EP changes to "L", the flip-flop made up of the nMOS transistors QN1 and QN2 and the flip flop made up of the pMOS transistors QP1 and QP2 are activated. Then, the potential difference between the input nodes Q and /Q is magnified and one of Q and /Q of which the initial potential is lower than that of the other becomes VSS when the other of Q and /Q of which the initial potential is higher becomes VCC.

The latch sense amplifier circuit senses and amplifies the potential difference between the input nodes Q and /Q until the higher potential node changes to VCC and the lower potential node to VSS. Thus, this sense amplifier circuit is employed in most of the DRAMs in which a change in potential of the bit line caused by charges in memory cells is read out, amplified, and rewritten. In a sense amplifier circuit of this type, the time required for an output to reach VCC or VSS is shorter, as the initial potential difference between input signals is larger.

A known example of a sense amplifier circuit used in a high-speed bus system is one having an arrangement shown in FIG. 24 that is disclosed in U.S. Pat. No. 5,355,391 filed by Mark A. Horowitz, et al. This sense amplifier circuit senses and amplifies an input potential difference at a high speed with a combination of a first amplifier for sensing a small potential difference and a second amplifier for outputting a large-amplitude output. The first amplifier is constituted by MOS transistors M1, M2, M3, . . . , M9 and transfer gates T1 and T2, and senses the potential difference between the input terminals Q and /Q. The nMOS transistors M1 and M2 serve as a current source. The potentials of the input terminals Q and /Q are input to a pair of differential nMOS transistors M3 and M4 via the CMOS transfer gates T1 and T2. The PMOS transistors M8 and M9 serve as a load.

The potential difference between the two output nodes of the first amplifier is amplified by the second latch amplifier comprised of MOS transistors M10, M11, . . . , M15. The second amplifier has the same arrangement as that shown in FIG. 22.

FIG. 25 shows the operation waveform of the sense amplifier circuit in FIG. 24. In a standby state, Clk and /Clk are fixed to "L" and "H", respectively. In this state, the potentials of the input terminals Q and /Q are transmitted to the gate electrodes of the nMOS transistors M3 and M4 in the first amplifier. The drains of the nMOS transistors M3 and M4 float because the nMOS transistors M5 and M6 are OFF, and the common source between the nMOS transistors M3 and M4 also floats because the nMOS transistor M1 is OFF. The pMOS transistors M8 and M9 are OFF, and an nMOS transistor M16 is OFF. The active second amplifier fixes one of the output terminals Out and /Out to VSS and the other to VCC.

When the state changes to Clk="H" and /Clk="L" the nMOS transistors M1, M5, and M6 and pMOS transistors M8 and M9 are turned on to activate the first amplifier. At the same time, the nMOS transistor M16 is turned on to equalize the potentials of the output terminals Out and /Out. In this case, if the pMOS transistors M8 and M9 are designed to have sufficiently high drive abilities, a small potential difference around VCC/2 that reflects the input potential difference in the first amplifier can be detected between the output nodes Out and /Out.

When the state changes again to Clk="L" and /Clk="H", the nMOS transistors M5 and M6 are turned off to activate the second amplifier again and amplify the potentials of the output nodes Out and /Out to VCC and VSS, and vice versa.

The operation principle of the second amplifier is the same as in FIG. 22. As the gain of the first amplifier is larger than unity, i.e., the output potential difference of the first amplifier is larger than the input potential difference, the amplifier circuit in FIG. 24 can determine its output at a higher speed than the amplifier circuit in FIG. 22.

In the amplifier circuit of FIG. 24, noise is hardly generated at the input nodes Q and /Q because the first amplifier is inactive in a standby state, and the drains of the transistors M3 and M4 are disconnected from the output nodes Out and /Out. When Clk="H", the first amplifier is activated and the potentials at the sources and drains of the nMOS transistors M3 and M4 vary. At this time, since the transfer gates T1 and T2 are OFF, no noise flows back into the input terminals Q and /Q. Accordingly, this amplifier circuit is suitably used for an arrangement in which a plurality of amplifiers are connected to the same input terminal node, e.g., for a bus line for connecting a plurality of semiconductor chips on board.

For the sense amplifier circuit to operate, the levels of the control clock signals must change twice, as described above. In addition, this sense amplifier circuit consumes a large power because a punch-through current flows from VCC to VSS for the operation of the first amplifier while Clk="H" and /Clk="L".

The current can be suppressed by adjusting a gate bias VBIAS to the transistor M2. But the high-speed operation is not achieved when the transistor M2 limits the current to too small amount, because a sufficient gain of the first amplifier is not obtained, resulting in the small initial inputs potentials of the second latch amplifier.

On the other hand, the total power consumption due to the punch-through current can be suppressed if the operation period of the first amplifier, while Clk="H" and /Clk="L", is shortened. But the pulse widths of the clock signals Clk and /Clk must be decreased to shorten this period. A representative time to determine the output potential in the sense amplifier circuit is about 1 nsec. Therefore, with a pulse width larger than 1 nsec, the power is wastefully consumed.

In general, it is difficult to build a circuit that can output a short pulse with high precision within an actual semiconductor circuit when a signal line driven by the pulse has a large parasitic capacitance and a high parasitic resistance. For example, a signal line with a resistance of 1 kΩ and a parasitic capacitance of 1 pF has a transfer delay time of 1 nsec, so this signal line cannot accurately transfer a pulse having a time width of 1 nsec or less. To normally control the circuit, a pulse longer than 1 nsec must be generated and this excessively consumes power.

As described above, in the conventional sense amplifier circuit shown in FIG. 24, since the control signal must change twice, the speed cannot be increased with a large-parasitic-capacitance, high-parasitic-resistance control signal line, and the power consumption is large because the punch-through current flows from the power supply VCC to VSS for a predetermined period.

BRIEF SUMMARY OF THE INVENTION

The present invention has been made to solve the above problems, and has as its object to provide a sense amplifier circuit capable of determining an output with small power consumption at high speeds and simplifying a control signal.

A sense amplifier circuit according to the present invention comprises two input terminals, a first amplifier for sensing a potential difference between the two input terminals and outputting differential outputs, a first activation circuit controlled by a clock signal to activate the first amplifier, a second, latch amplifier which has two input/output nodes for directly receiving the differential outputs from the first amplifier, and amplifies and latches the differential outputs from the first amplifier, two output terminals respectively extracted from the two input/output nodes of the second amplifier, and a second activation circuit controlled by the clock signal to activate the second amplifier at almost the same time as the activation of the first amplifier.

The present invention preferably further comprises a precharge circuit controlled by the clock signal to set the two input/output nodes of the second amplifier at a predetermined potential prior to activation of the first and second amplifiers. The first and second amplifiers may use the same load.

In the present invention, for reliable sense operation, for example, the second activation circuit is cascade-connected to the first activation circuit so as to turn on after the first activation circuit. Alternatively, the second activation circuit may comprise a delay element so as to turn on after the first activation circuit.

To reduce the power consumption upon determination of an output, the present invention preferably further comprises switching elements which are inserted on the paths of currents flowing from the two input/output nodes of the second amplifier to the reference potential through the first amplifier, and are correspondingly cut-off in accordance with the result of the amplification.

In the sense amplifier circuit according to the present invention, outputs from the first differential amplifier are directly input to the input/output nodes of the second latch amplifier, and the first and second amplifiers are activated at almost the same time under clock control to sense a small potential difference. As a result, sense operation can be performed at higher speed than in a conventional circuit in which the clock must change twice between detection of a small signal at the input terminal and determination of an output. In addition, the control clock need not be complementary clocks, unlike the conventional circuit, thereby simplifying the control signal.

In the sense amplifier circuit of the present invention, the first and second amplifiers share the load to further simplify the circuit arrangement.

Although the first and second amplifiers are activated at almost the same time, their activation timings preferably slightly differ. For example, a delay element is added to the second activation circuit associated with the second amplifier to slightly delay the ON timing of the second activation circuit from that of the first activation circuit associated with the first amplifier. This can prevent any malfunction caused by variations in thresholds of MOS transistors in use to obtain an output reliably reflecting a small potential difference between the input terminals.

Furthermore, switching elements which are controlled by determined potentials of the input/output nodes to automatically interrupt current paths are inserted on the current paths between the two input/output nodes of the second amplifier and the reference potential terminal of the first amplifier. This can eliminate a wasteful current flowing through the first amplifier upon determination of an output, thereby effectively reducing the power consumption of the sense amplifier circuit. Since the current is automatically interrupted when the outputs are determined, no complicated control is required, and high-speed performance is not degraded, unlike the conventional circuit in which the current is interrupted under clock control.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
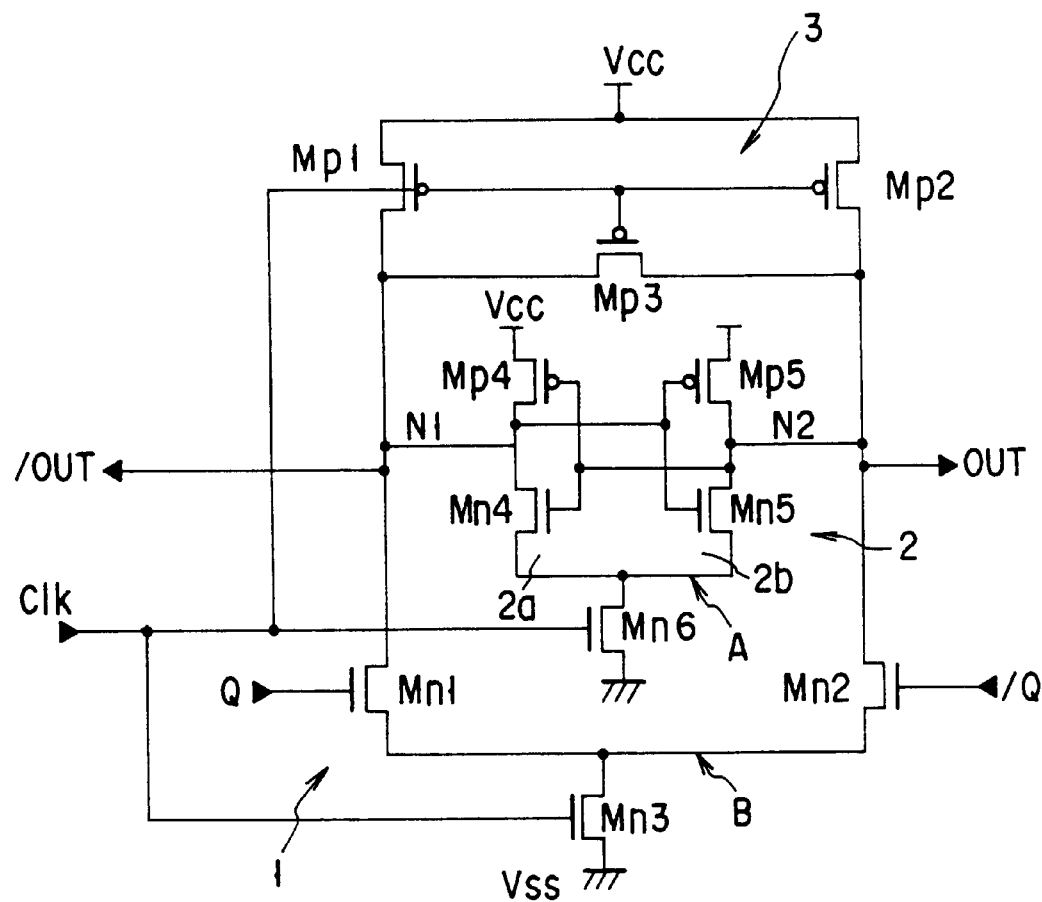
FIG. 1 is a circuit diagram showing a sense amplifier circuit according to the first embodiment of the present invention.
Figure 3:
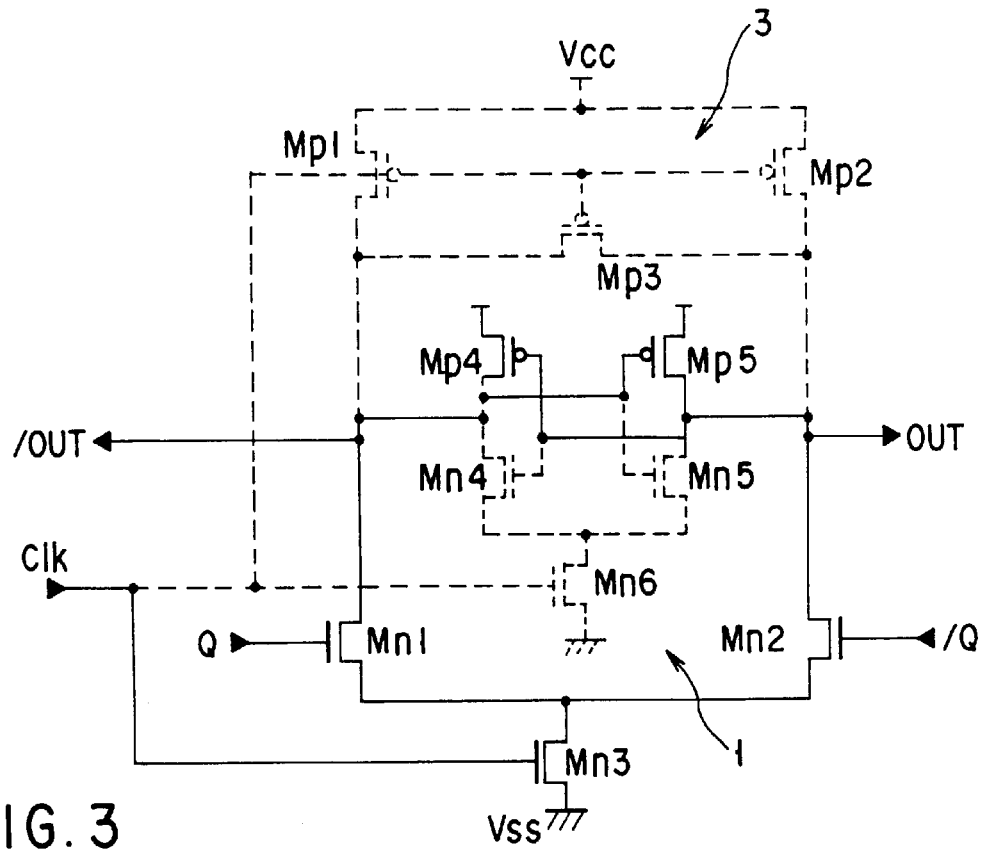
FIG. 3 is a circuit diagram emphatically showing the first amplifier portion of the sense amplifier circuit according to the first embodiment.

Embodiments of the present invention will be described below with reference to the several views of the accompanying drawing. FIG. 1 shows a sense amplifier circuit according to the first embodiment of the present invention. This sense amplifier circuit comprises a first amplifier 1 mainly made up of a pair of driver nMOS transistors Mn1 and Mn2 with their gates respectively connected to two input terminals Q and /Q. The pair of nMOS transistors Mn1 and Mn2 in the first amplifier 1 form a differential circuit, while a common source (first activation node) B is connected to a ground terminal VSS (first power supply terminal) via a first activation nMOS transistor Mn3, and the drains are connected to a power supply terminal VCC (second power supply terminal) via PMOS transistors Mp4 and Mp5 which operate as a load. FIG. 3 shows a portion corresponding to the first amplifier 1 by solid lines.

A differential output from the first amplifier 1 is directly input to input/output nodes N1 and N2 in a second amplifier 2. The second amplifier 2 is a latch circuit (flip-flop circuit) constituted by a pair of nMOS transistors Mn4 and Mn5 on the VSS side, and the pair of pMOS transistors Mp4 and Mp5 on the VCC side. The sources of the pair of nMOS transistors Mn4 and Mn5 are connected to a common source (second activation node) A, the drains are respectively connected to the input/output nodes N1 and N2, and the gates are respectively cross-connected to the input/output nodes N2 and N1. The sources of the pair of PMOS transistors Mp4 and Mp5 are connected in common to VCC, the drains are respectively connected to the input/output nodes N1 and N2, and the gates are respectively cross-connected to the input/output nodes N2 and N1.

In the second amplifier 2, the nMOS and PMOS transistors Mn4 and Mp4 are equivalent to a first CMOS inverter 2a, and the nMOS and PMOS transistors Mn5 and Mp5 to a second CMOS inverter 2b. In other words, the second amplifier 2 is constructed by cross-connecting the inputs and outputs of the two CMOS inverters 2a and 2b.

Figure 4:
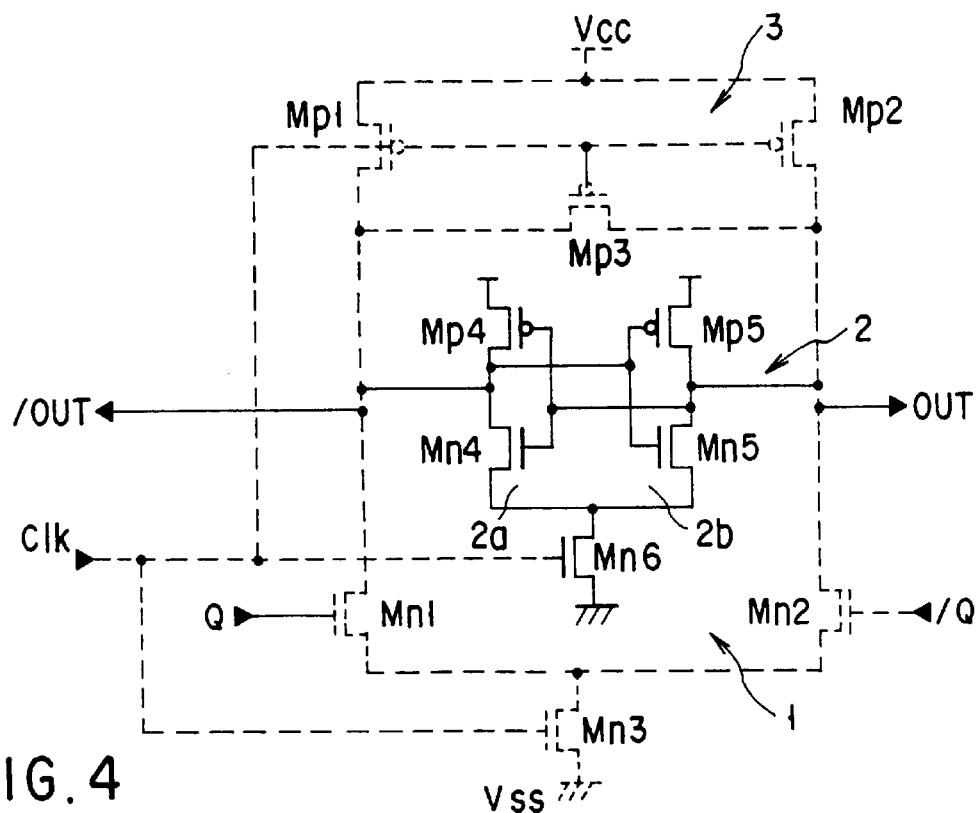
FIG. 4 is a circuit diagram emphatically showing the second amplifier portion of the sense amplifier circuit according to the first embodiment.

The common source A between the nMOS transistors Mn4 and Mn5 serving as the second activation node is connected to the ground terminal VSS via a second activation nMOS transistor Mn6. The input/output nodes N1 and N2 of the second latch amplifier 2 respectively function as output terminals Out and /Out. FIG. 4 shows a portion corresponding to the second amplifier 2 by solid lines.

The pMOS transistors Mp4 and Mp5 are shared by the first and second amplifiers, and they serve as the load of the first amplifier 1 and the PMOS flip-flop of the second amplifier 2.

The input/output nodes N1 and N2 are connected to the power supply terminal VCC via PMOS transistors Mp1 and Mp2. A PMOS transistor Mp3 for short-circuiting the input/output nodes N1 and N2 is provided. The pMOS transistors Mp1 to Mp3 constitute a precharge circuit 3 for holding the input/output nodes N1 and N2, i.e., output terminals /Out and Out at VCC in a standby state.

The gates of the activation nMOS transistors Mn3 and Mn6 in the first and second amplifiers 1 and 2 are simultaneously driven by a clock signal Clk. The gates of the PMOS transistors Mp1 to Mp3 forming the precharge circuit 3 are similarly driven by the clock signal Clk.

One feature of the sense amplifier circuit of the first embodiment is that the first and second amplifiers 1 and 2 are not disconnected but are directly connected in one circuit. Another feature is that the first and second amplifiers 1 and 2 are nearly simultaneously operated.

Figure 2:
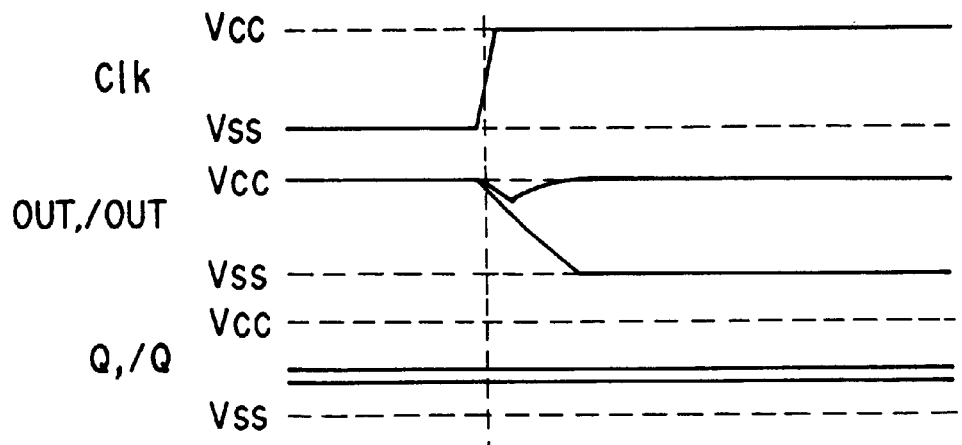
FIG. 2 is a waveform chart showing the operation of the sense amplifier circuit according to the first embodiment.

Detailed operation of the amplifier circuit of the first embodiment will be described with reference to the operation waveform in FIG. 2. In a standby state, as Clk="L", both the two activation nMOS transistors Mn3 and Mn6 are OFF, and thus both the first and second amplifiers 1 and 2 are inactive. At this time, the precharge circuit 3 is active. The output terminals Out and /Out are charged to VCC by the precharge PMOS transistors Mp1 and Mp2, and at the same time they are short-circuited to VCC by the short-circuiting pMOS transistor Mp3.

When the state changes to Clk="H", the first and second amplifiers 1 and 2 are activated almost simultaneously. A small potential difference between the input terminals Q and /Q is amplified by the first amplifier 1, and an output from the first amplifier 1 is amplified by the second amplifier 2. That is, the potentials at the output terminals Out and /Out precharged to VCC drop at different speeds in accordance with the difference in conductivity between a pair of differential nMOS transistors Mn1 and Mn2 in the first amplifier 1. When the potential difference increases to a certain degree, the potential difference between the output terminals Out and /Out is amplified by positive feedback operation of the second amplifier 2 until one of the output terminals Out and /Out reaches VCC, and the other reaches VSS.

Figure 24:
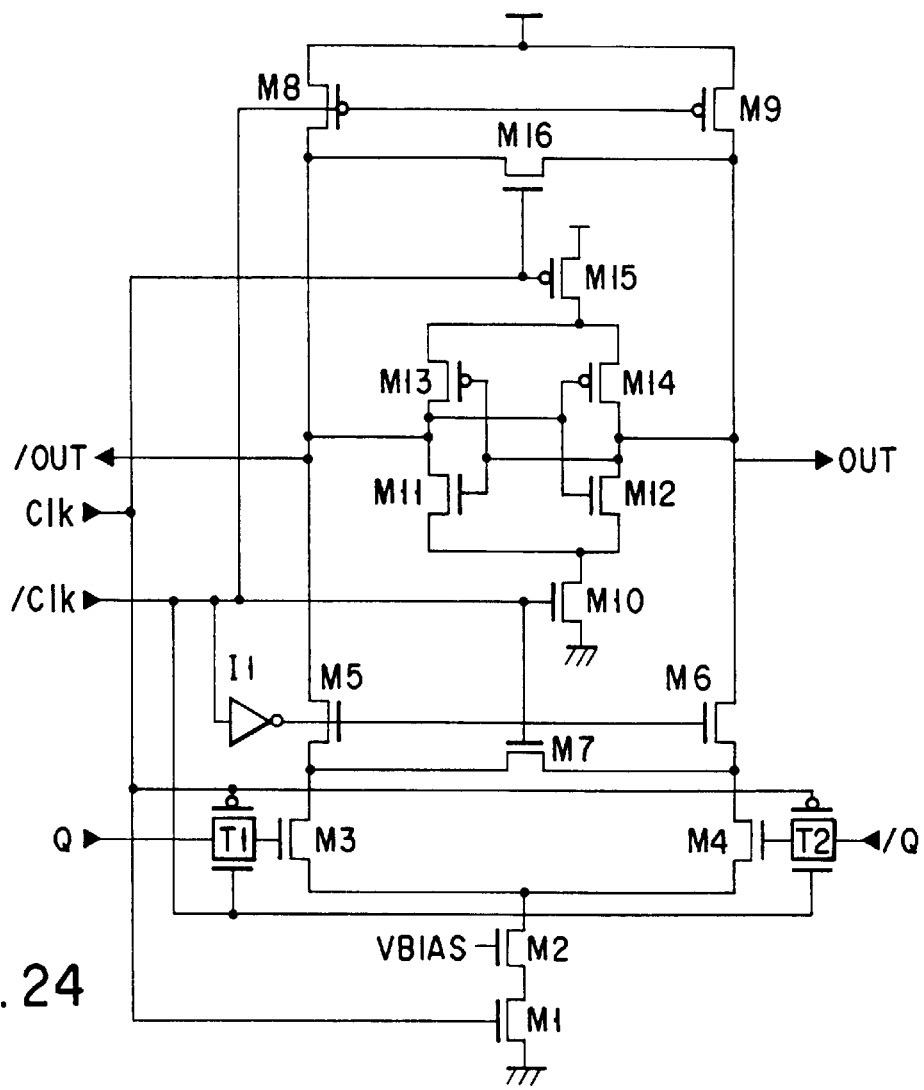
FIG. 24 is a circuit diagram showing another example of the conventional sense amplifier circuit.
Figure 25:
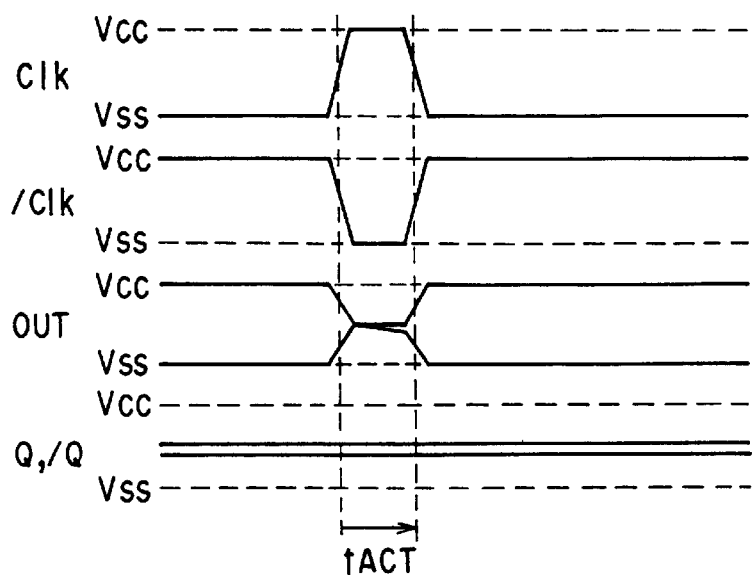
FIG. 25 is a waveform chart showing the operation of the sense amplifier circuit in FIG. 24.

The first embodiment realizes high-speed operation because the first amplifier 1 and the second amplifier 2 are directly connected and they operate simultaneously upon one change of clock signal Clk to determine an output. The two amplifiers 1 and 2 share the pMOS transistors Mp4 and Mp5 as a load, and the circuit arrangement is simpler than the circuit arrangement in FIG. 24. As for the clock signal, no complementary clock signals are necessary unlike the circuit in FIG. 24.

Figure 5:
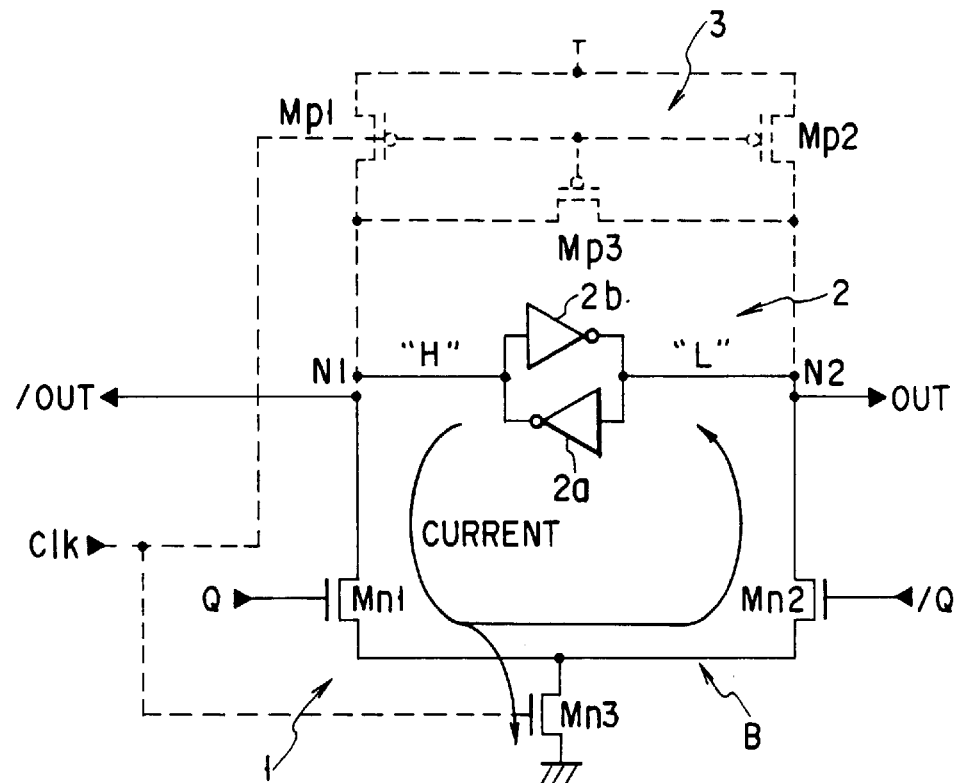
FIG. 5 is a circuit diagram showing a current flowing upon determination of an output in the sense amplifier circuit according to the first embodiment.

In the amplifier circuit of the first embodiment, as shown in FIG. 5, a current flows from the power supply terminal VCC to the ground terminal VSS via the first amplifier 1 even after an output is determined. To reduce this current, e.g., the nMOS transistors Mn1 to Mn3 constituting the first amplifier 1 preferably have small gate widths. An embodiment capable of eliminating the current consumption upon determination of an output will be described below.

In the sense amplifier circuit of the first embodiment, a pair of differential nMOS transistors Mn1 and Mn2 forming the first amplifier 1 preferably have the same characteristics, such as threshold, in order to ensure a large operation margin. For the same reason, each of pairs of nMOS transistors Mn4 and Mn5 and pMOS transistors Mp4 and Mp5 forming the second amplifier 2 has the same threshold. As a preferred embodiment, therefore, the channel lengths of these transistors are set larger than those of the remaining transistors. This is because variations in threshold due to a short channel effect resulting from process variations are generally small for a large channel length.

As a more preferable embodiment, the thresholds of a pair of nMOS transistors Mn1 and Mn2 may be intentionally set low. For example, the thresholds of a pair of nMOS transistors Mn1 and Mn2 may be decreased by channel ion implantation or the like. When the potentials of the input nodes Q and /Q are equal to or lower than the thresholds of the nMOS transistors Mn1 and Mn2, the nMOS transistors Mn1 and Mn2 do not flow any current, so the first amplifier 1 does not operate. Accordingly, decreasing the thresholds of the driving transistors Mn1 and Mn2 widens the input potential allowable range.

Figure 6:
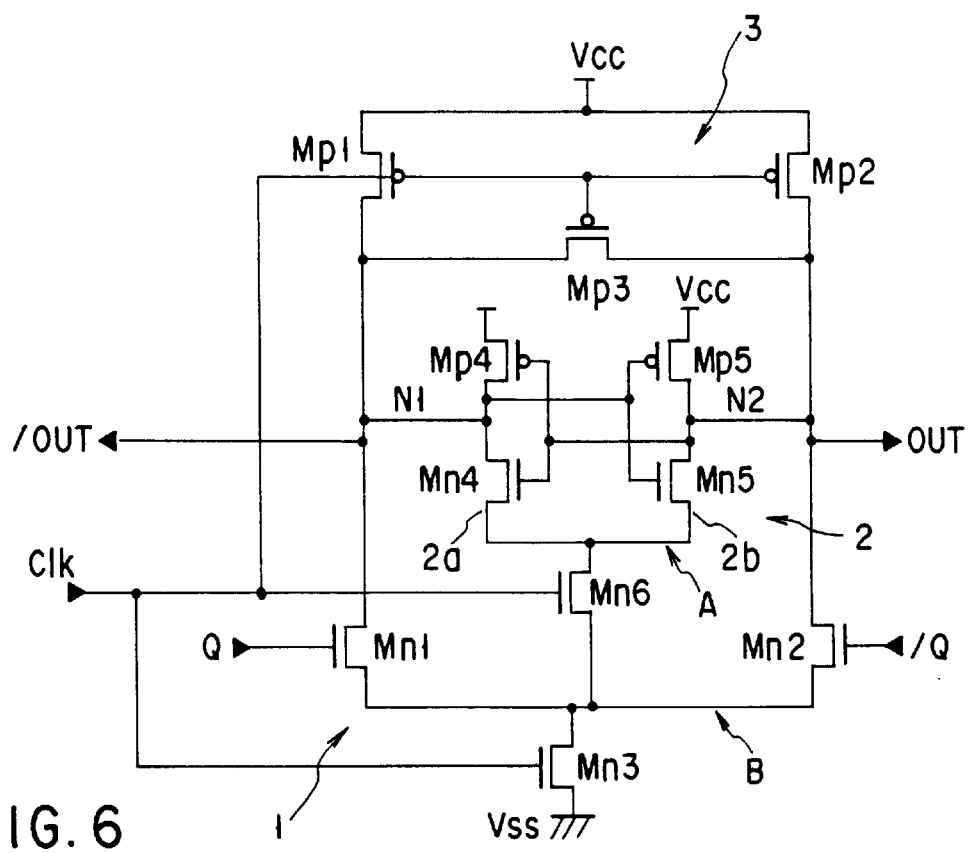
FIG. 6 is a circuit diagram showing a sense amplifier circuit according to the second embodiment of the present invention.

FIG. 6 shows a sense amplifier circuit according to the second embodiment of the present invention. The same reference numerals as in FIG. 1 denote the same parts, and a detailed description thereof will be omitted. In the second embodiment, the source of a second activation nMOS transistor Mn6 in a second amplifier 2 is connected to not the ground terminal VSS but a common source B, i.e., the drain of a first activation nMOS transistor Mn3 in a first amplifier 1. In other words, the two activation circuits are cascade-connected. After the first activation nMOS transistor Mn3 is turned on to ground the common source B, the second activation nMOS transistor Mn6 grounds a common source A via the common source B.

In the embodiment of FIG. 1, the first amplifier 1 and the second latch amplifier 2 simultaneously start operating. According to the operation principle of the first embodiment, the first amplifier 1 generally operates at very high speeds, and a signal amplified by it is further amplified by the second latch amplifier 2. At this time, however, the second amplifier 2 may erroneously latch inverted data not reflecting the potential difference between the input terminal Q and /Q owing to variations in thresholds of a pair of differential nMOS transistors Mn4 and Mn5 in the second amplifier 2.

In the sense amplifier circuit of the embodiment in FIG. 6, when the clock signal Clk="H", the activation nMOS transistor Mn3 in the first amplifier 1 is turned on to decrease the potential of the common source B, thereby turning on the activation nMOS transistor Mn6 in the second amplifier 2. That is, the first amplifier 1 is activated, and then the second amplifier 2 is activated with a slight delay. As a result, a signal can be reliably amplified without any malfunction.

Figure 7:
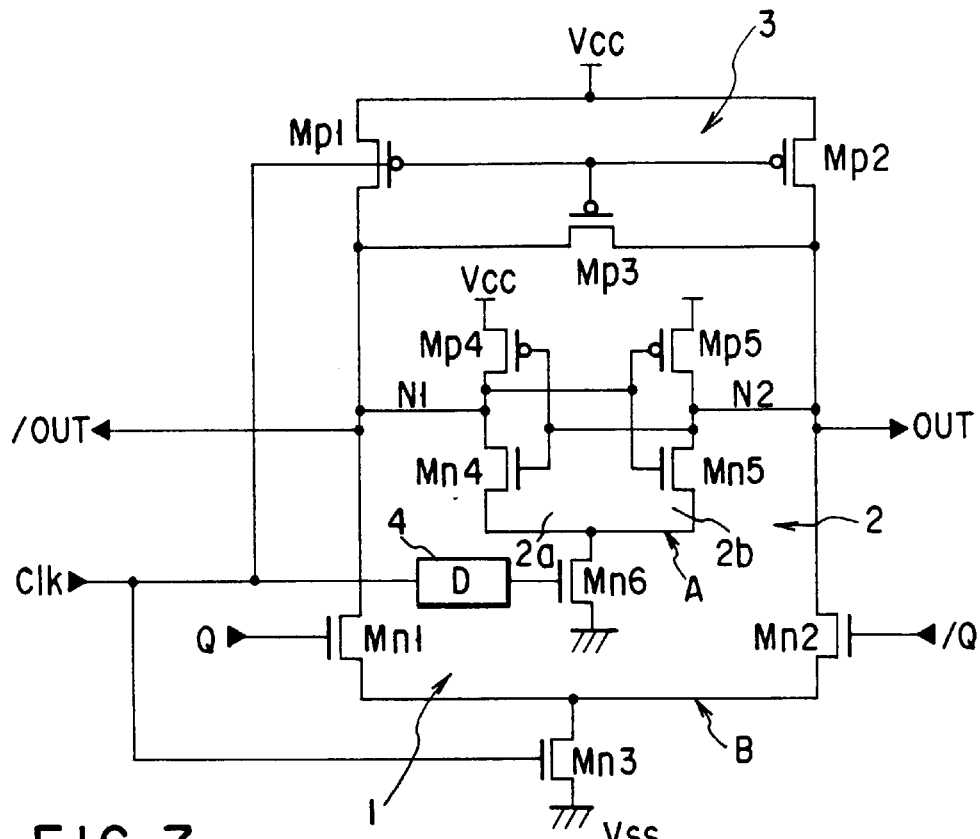
FIG. 7 is a circuit diagram showing a sense amplifier circuit according to the third embodiment of the present invention.

FIG. 7 shows a sense amplifier circuit according to the third embodiment of the present invention. In the third embodiment, a delay element 4 is added to the gate terminal of an activation nMOS transistor Mn6 in a second amplifier 2 for the same purpose as in the embodiment of FIG. 6. That is, the clock signal Clk is transferred to the activation nMOS transistor Mn6 with a slight delay from a clock signal to an activation nMOS transistor Mn3 in a first amplifier 1. The remaining arrangement is the same as in the embodiment of FIG. 1.

Also in the third embodiment, the activation timing of the second amplifier 2 is later than that of the first amplifier 1. Therefore, a signal can be reliably amplified without any malfunction, similar to the circuit of the embodiment in FIG. 6.

Figure 8A:
FIGS. 8A to 8E are circuit diagrams showing examples of a delay element used in the sense amplifier circuit according to the third embodiment.
Figure 8B:
Figure 8C:
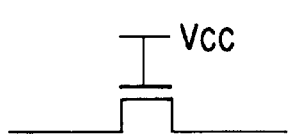
Figure 8D:
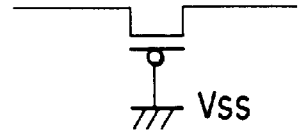
Figure 8E:
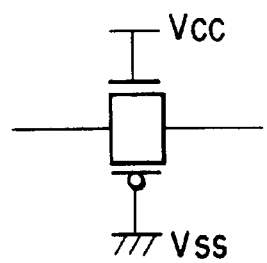

There may be various examples of the delay element 4 which can be used in the embodiment of FIG. 7, for instance, an inverter chain shown in FIG. 8A, a resistor shown in FIG. 8B, an nMOS transistor shown in FIG. 8C with a gate fixed to VCC and using a transfer time from the source to drain, a pMOS transistor shown in FIG. 8D with a gate fixed to VSS, and a combination of nMOS and pMOS transistors shown in FIG. 8E.

Figure 9:
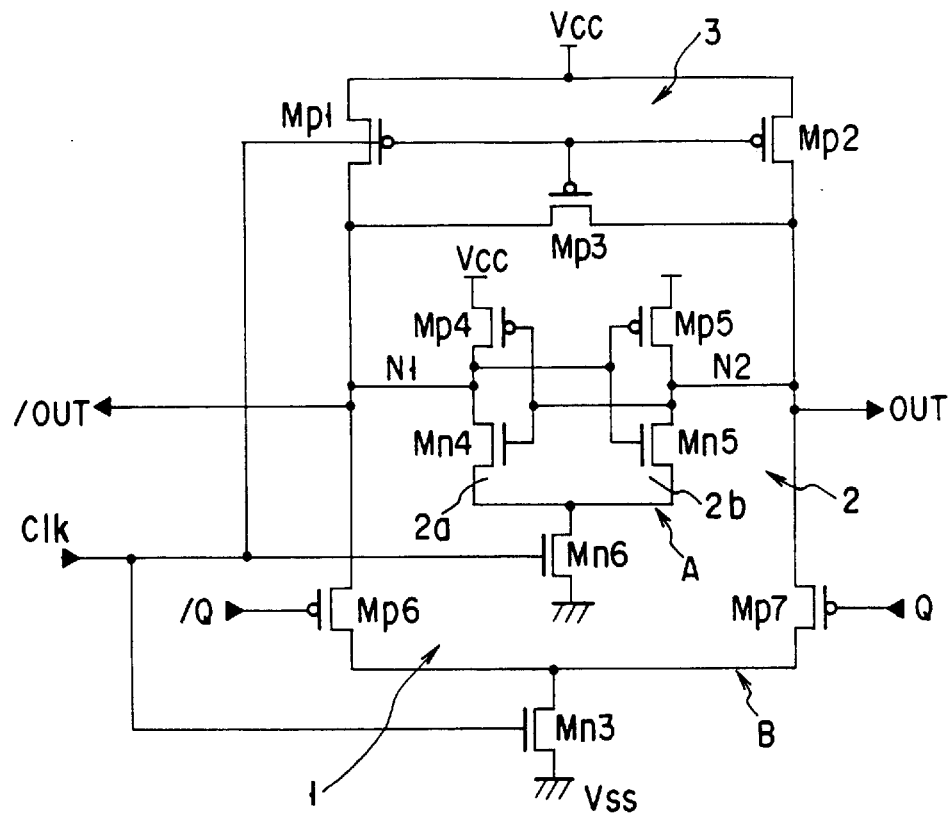
FIG. 9 is a circuit diagram showing a sense amplifier circuit according to the fourth embodiment of the present invention.

FIG. 9 shows a sense amplifier circuit according to the fourth embodiment of the present invention. In the fourth embodiment, a pair of PMOS transistors Mp6 and Mp7 replace a pair of differential nMOS transistors Mn1 and Mn2 constituting the first amplifier 1 in the embodiment of FIG. 1. Also, the input signals Q and /Q are changed with each other in position. The remaining arrangement is the same as in the embodiment of FIG. 1.

Unlike the first to third embodiments, the source of the sense transistors Mp6 and Mp7 are not fixed to the potential of supply voltage. However, as only instantaneous difference in drivabilities of the sense amplifier in accordance with the potential difference of input terminal Q and /Q is needed for the operation of the amplifier, the PMOS driver transistors Mp6 and Mp7 can be used. This operation also can be achieved by using the PMOS transistors Mp6 and Mp7. Letting Vtp be the thresholds of the pMOS transistors Mp6 and Mp7, if the potential of, e.g., the input terminal /Q is VCC−|Vtp| or less, the pMOS transistor Mp6 is instantaneously turned on to flow a current. The source of the PMOS transistor Mp6 is connected to the node N1; its potential is not fixed. Upon current flow through the pMOS transistor Mp6, the source level of Mn6 is lowered and the current flowing through Mn6 becomes smaller because the source-to-gate voltage difference reduces. However, if the instantaneous current generates a certain potential difference or more between the input/output nodes N1 and N2 in accordance with the relative potential difference of input nodes Q and /Q, this difference is sensed and amplified by the second amplifier 2.

As is well known, the ratio of a change in current drive ability of the MOS transistor to a change in gate potential is generally maximum around the threshold. Letting Vtn be the threshold of the nMOS transistor, when the potentials of the input terminals Q and /Q change about Vtn, a pair of nMOS transistors are preferably used for the first amplifier 1, as in the above embodiments. When, however, the input terminals Q and /Q operate around the potential of VCC–|Vtp|, a pair of PMOS transistors Mp6 and Mp7 are preferably used as in the fourth embodiment.

Figure 10:
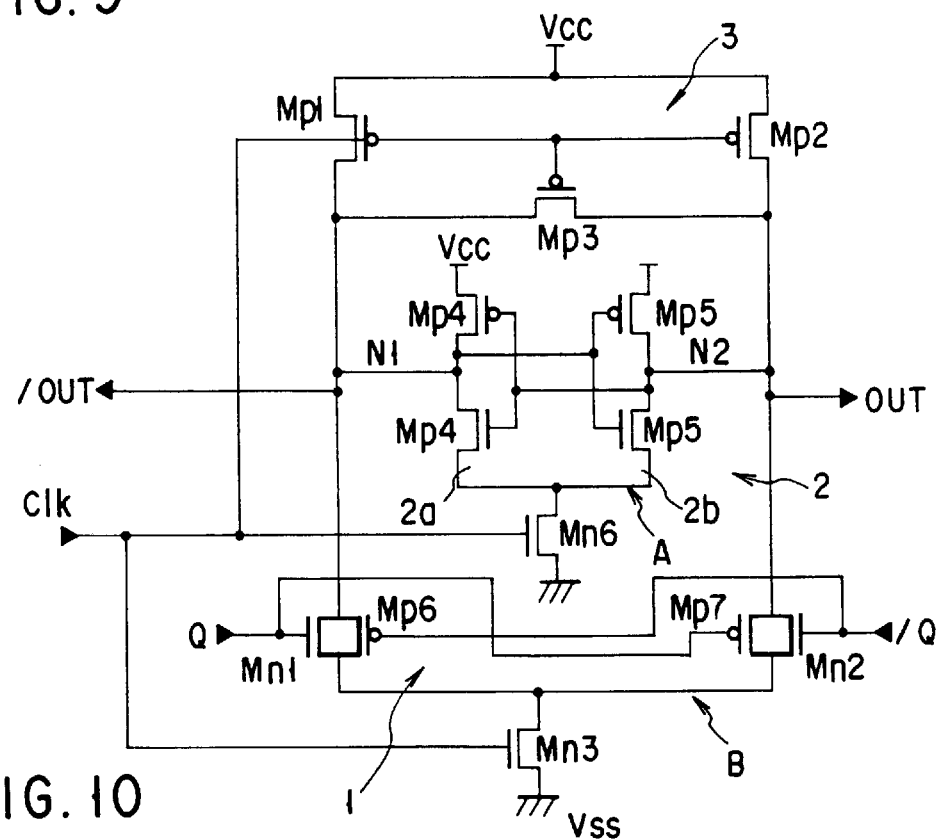
FIG. 10 is a circuit diagram showing a sense amplifier circuit according to the fifth embodiment of the present invention.

FIG. 10 shows a sense amplifier circuit according to the fifth embodiment of the present invention. In the fifth embodiment, a combination of a pair of nMOS transistors Mn1 and Mn2 and a pair of pMOS transistors Mp6 and Mp7 is used as a pair of differential transistors for a first amplifier 1. As described in the first embodiment, the nMOS transistor does not operate at a low input potential around VSS equal to or lower than the threshold Vtn. To the contrary, the pMOS transistor does not operate at an input potential around VCC higher than VCC–|Vtp|. The fifth embodiment realizes a sense amplifier circuit which can operate in a wide input potential range.

Figure 11:
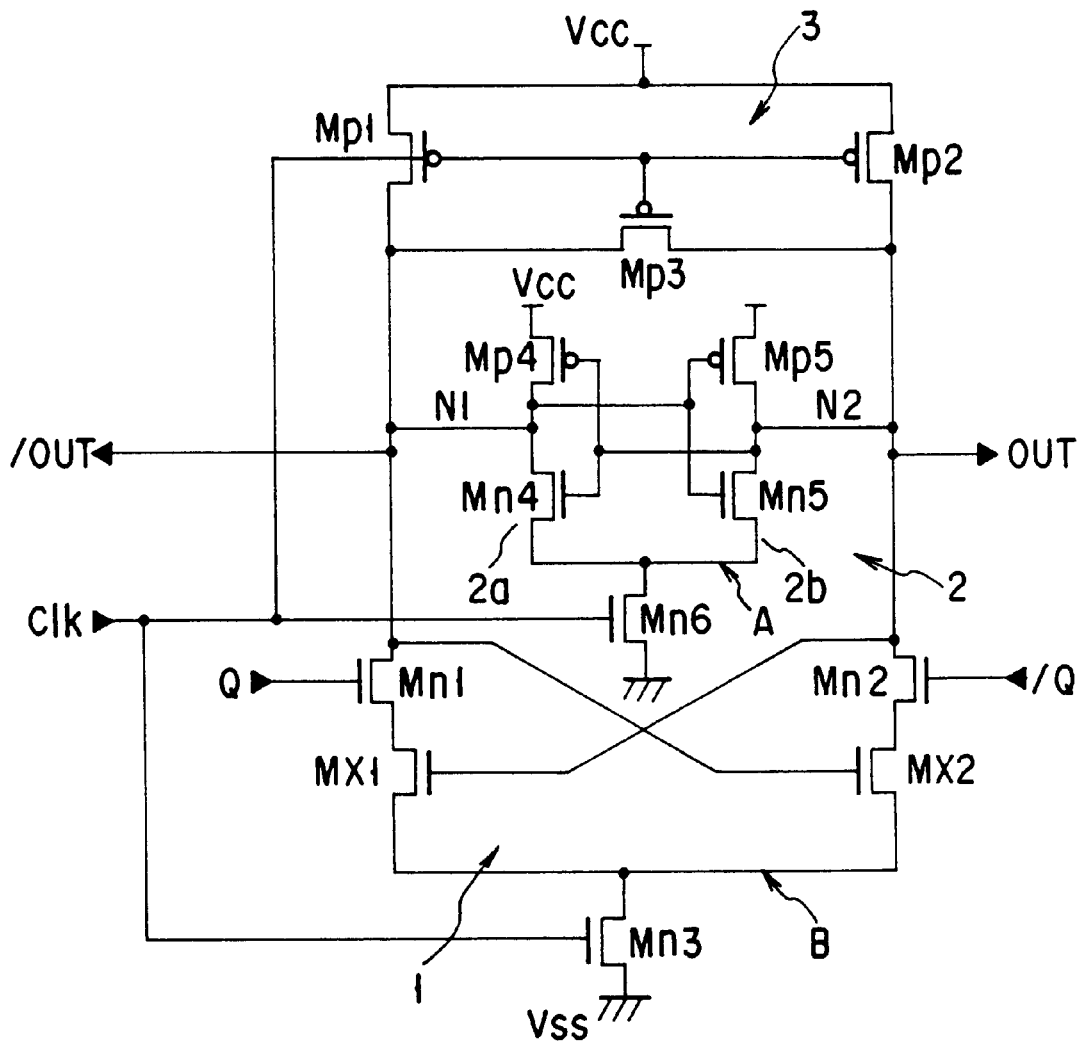
FIG. 11 is a circuit diagram showing a sense amplifier circuit according to the sixth embodiment of the present invention.

FIG. 11 shows a sense amplifier circuit according to the sixth embodiment of the present invention. In the sense amplifier circuits of the above embodiments, a current flows through the first amplifier 1 even after an output potential is determined, as shown in FIG. 5. In the sixth embodiment, this unnecessary current upon determination of an output potential is automatically interrupted. That is, nMOS transistors MX1 and MX2 are inserted as current interruption switching elements on current paths between output terminals Out and /Out and a ground terminal VSS serving as the reference potential terminal of a first amplifier 1, i.e., between the sources of nMOS transistors Mn1 and Mn2 and the drain of an activation nMOS transistor Mn3 in the sixth embodiment. The gates of the nMOS transistors MX1 and MX2 are respectively connected to input/output nodes N2 and N1, i.e., the output terminals Out and /Out. The remaining arrangement is the same as in the embodiment of FIG. 1.

In the sense amplifier circuit of the sixth embodiment, for example, the output terminals Out and /Out are respectively latched to "H" (=VCC) and "L" (=VSS). Then, the nMOS transistor MX2 is turned off to automatically interrupt the current path extending from the "H" output terminal Out to VSS. In a reverse output state, the nMOS transistor MX1 is similarly turned off to interrupt the current path extending from the "H" output terminal /Out to VSS. According to the sixth embodiment, therefore, flow of a wasteful current upon determination of data can be eliminated to effectively reduce the power consumption. In addition, no clock control need be performed to interrupt a current, unlike the conventional method in FIG. 24.

In a standby state, since both the output terminals Out and /Out are precharged to VCC, as described in the first embodiment, the gate potentials of the nMOS transistors MX1 and MX2 are at VCC. The nMOS transistors MX1 and MX2 are ON until an output is determined by a second latch amplifier 2, more specifically, until the potential of one output terminal decreases to the thresholds of the nMOS transistors MX1 and MX2 or less. This realizes the same amplification as in the first embodiment.

In the embodiment of FIG. 11, the current interruption nMOS transistors MX1 and MX2 are formed on the source sides of the driver nMOS transistors Mn1 and Mn2, but can be formed on the drain sides thereof to perform the same operation.

Figure 12:
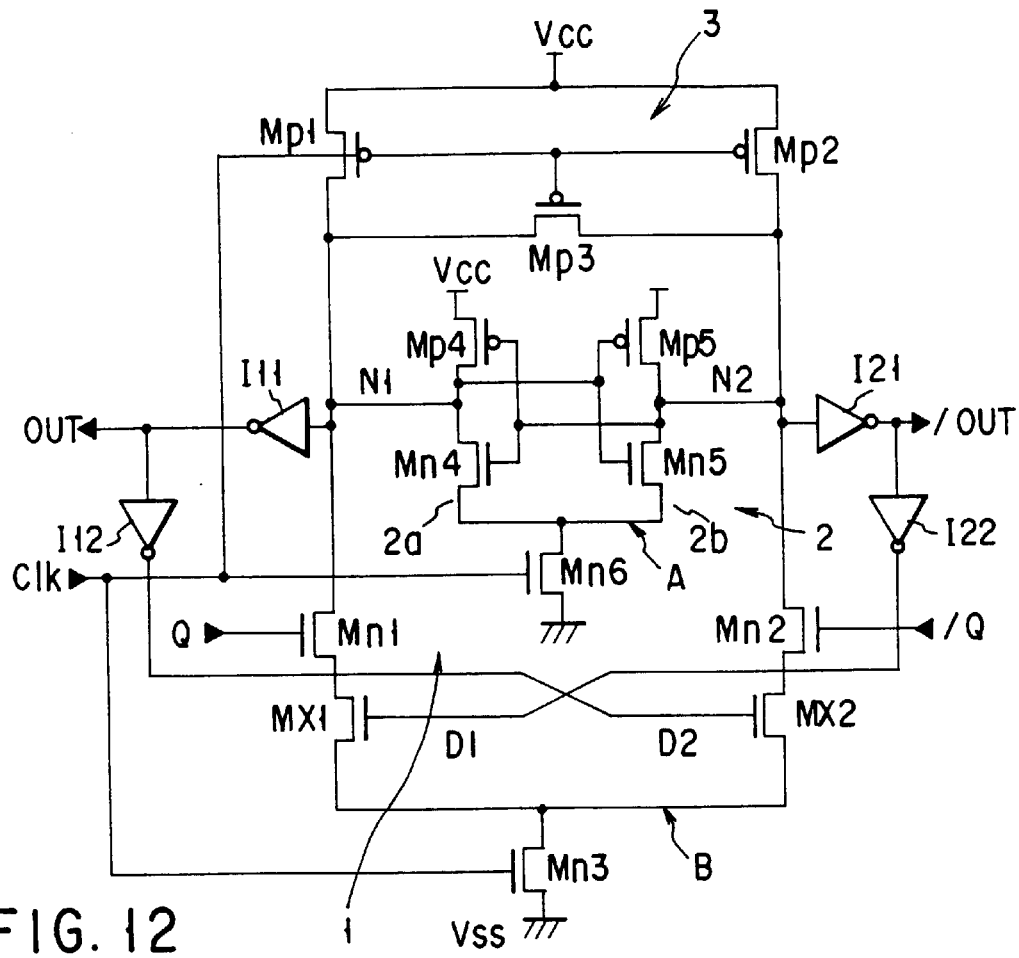
FIG. 12 is a circuit diagram showing a sense amplifier circuit according to the seventh embodiment of the present invention.

FIG. 12 shows a sense amplifier circuit according to the seventh embodiment as a modification of the embodiment in FIG. 11. In the seventh embodiment, input/output nodes N1 and N2 of a second latch amplifier 2 are respectively connected to output terminals Out and /Out via inverters I11 and I21, and the output terminals Out and /Out are respectively connected to the gates of current interruption nMOS transistors MX1 and MX2 via inverters I12 and I22. The inverters I11, I12, I21, I22 are preferably CMOS inverters.

Figure 13:
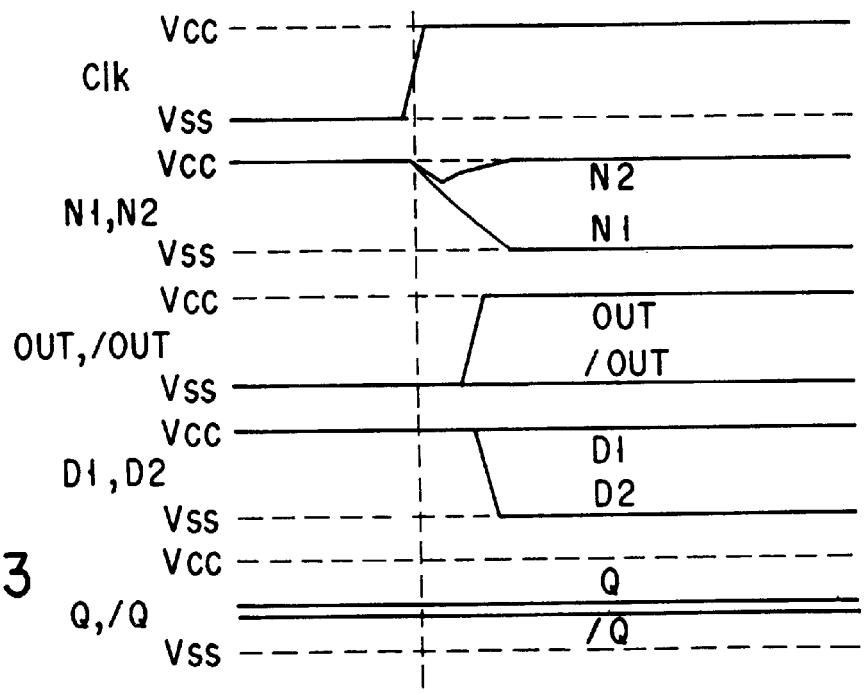
FIG. 13 is a waveform chart showing the operation of the sense amplifier circuit according to the seventh embodiment.

FIG. 13 shows the operation waveform of the seventh embodiment. In a standby state, since the input/output nodes N1 and N2 of the second amplifier 2 are precharged to VCC, both the output terminals Out and /Out are fixed to "L". At this time, the potentials of gate terminals D1 and D2 of the nMOS transistors MX1 and MX2 are at VCC, and the nMOS transistors MX1 and MX2 are ON. The sense amplifier circuit of the seventh embodiment operates similarly to the ones of the above embodiments to amplify the potentials of the nodes N1 and N2 to, e.g., "L" and "H", respectively, and change the potentials of the output terminals Out and /Out to "H" and "L", respectively. Then, the potentials of the gate terminals D1 and D2 respectively change to "H" (=VCC) and "L" (=VSS) to turn off the nMOS transistor MX2.

As a result, the power consumption can be reduced similar to the embodiment of FIG. 11. In the seventh embodiment, inverters are interposed between the output terminals Out and /Out and the input/output nodes N1 and N2 to stabilize the circuit. More specifically, the node N1 is precharged to VCC in a standby state and set VCC or VSS upon amplification. The first amplifier 1 operates to let a current flow from the power supply VCC to the ground terminal VSS through transistors Mp4, Mn1, MX1, and Mn3 or transistors Mp5, Mn2, MX2, and Mn3. Even when, therefore, the node N1 changes to VCC upon amplification, the potential of the node N1 temporarily becomes lower than VCC. Hence, in the embodiment of FIG. 11, the current driving ability is getting lower because the potential at the gates of nMOS transistors inserted on the current paths of first amplifier 1 becomes low, whereby the sensitivity of the first amplifier 1 is getting worse during the potential drop. An output from the inverter I11 having received the potential of the node N1 can maintain the potential VSS even upon a slight change in input potential. In other words, even if the potential of the node N1 slightly decreases from VCC, the output is kept fixed at VSS as far as the potential is equal to or higher than the threshold of the inverter I11. Consequently, an output from the amplifier circuit is at VSS in a standby state and at VCC or VSS upon amplification, and hardly takes an unstable potential state during amplification. Further, the sensibility is never getting worse during the operation of amplifiers 1 and 2, since the output from inverter I12 receiving the output of inverter I11 as an input, that is, the potential at the gate of nMOS transistor MX2 is being kept at Vcc until the output of the amplifier circuit is determined.

Figure 14:
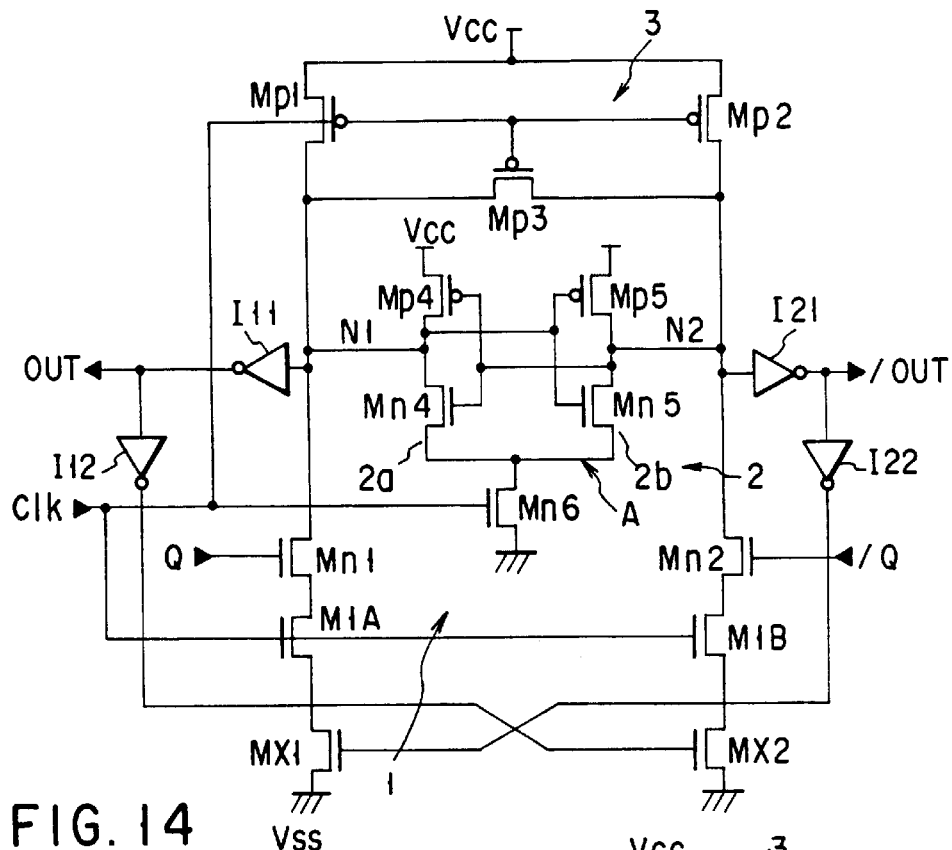
FIG. 14 is a circuit diagram showing a sense amplifier circuit according to the eighth embodiment of the present invention.

FIG. 14 shows a sense amplifier circuit according to the eighth embodiment of the present invention. In the circuit of the eighth embodiment, the activation nMOS transistor Mn3 of the first amplifier 1 in the embodiment of FIG. 12 is divided into two, and the two parts are respectively inserted as nMOS transistors MIA and MIB between driver nMOS transistors Mn1 and Mn2 and current interruption nMOS transistors MX1 and MX2. That is, the three MOS transistors are series-connected between the ground terminal VSS and nodes N1 and N2. The remaining arrangement is the same as in FIG. 12. The nMOS transistors MIA and MIB are controlled by the clock signal Clk, like the activation nMOS transistor Mn3 in FIG. 12.

In the embodiment of FIG. 12, when the clock signal Clk changes from "L" to "H", charges stored in parasitic capacitances between the sources and drains of the nMOS transistors MX1 and MX2 or capacitors formed in the gate and channel regions flow to the ground terminal VSS via the activation nMOS transistor Mn3. Further, the potentials of the input/output nodes N1 and N2 change via the MOS transistors Mn1 and Mn2.

In the eighth embodiment, charges stored in the parasitic capacitances of the nMOS transistors MX1 and MX2 flow to the ground terminal VSS before the clock signal Clk changes. The operation speed therefore increases by the time required to let charges flow in the parasitic capacitances, compared to the embodiment of FIG. 12.

Figure 15:
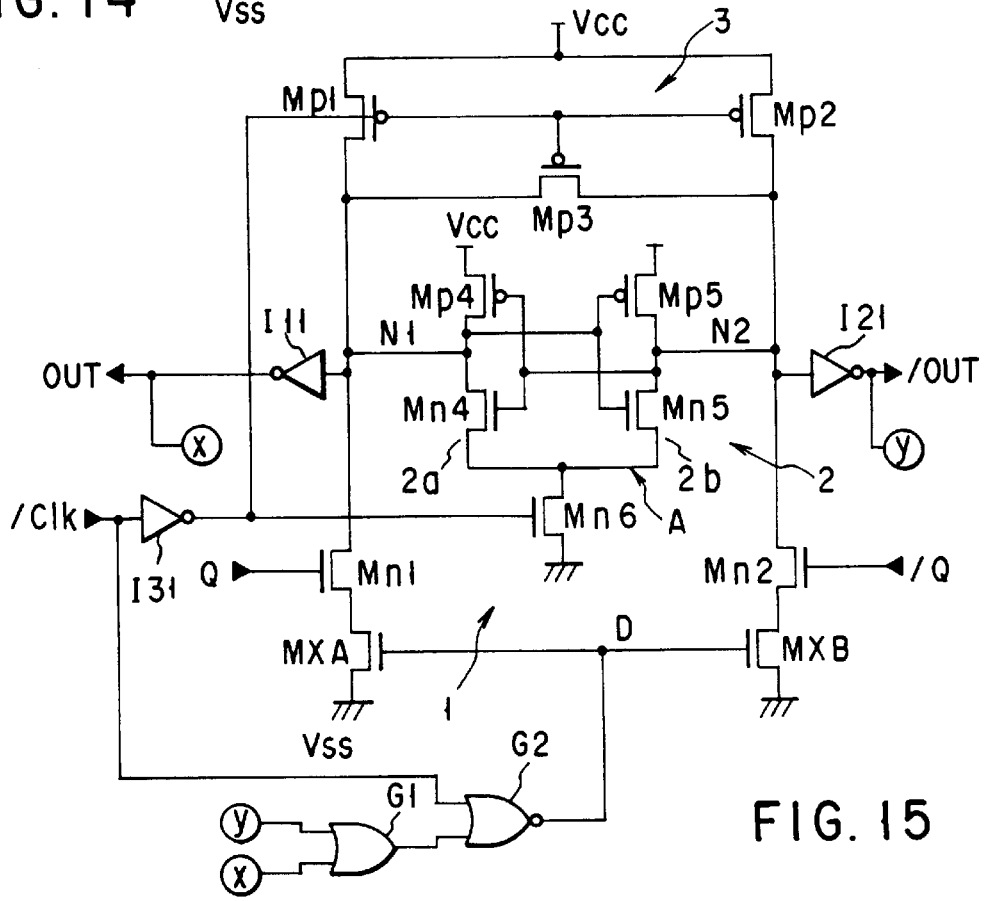
FIG. 15 is a circuit diagram showing a sense amplifier circuit according to the ninth embodiment of the present invention.

FIG. 15 shows a sense amplifier circuit according to the ninth embodiment of the present invention. In the ninth embodiment, the functions of the nMOS transistors MIA and MX1 in the embodiment of FIG. 14 are combined into one nMOS transistor MXA, whereas the functions of nMOS transistors MIB and MX2 are combined into one nMOS transistor MXB. In other words, the nMOS transistors MXA and MXB formed between the sources of a pair of driver MOS transistors Mn1 and Mn2 and the ground terminal VSS are used to activate a first amplifier 1 and interrupt a current. For this purpose, an OR gate Gi for ORing data x and y of output terminals Out and /Out, and a NOR gate G2 for receiving an output from the OR gate GI and the clock signal /Clk are arranged. An output from the NOR gate G2 controls the gates of the nMOS transistors MXA and MXB.

Figure 16:
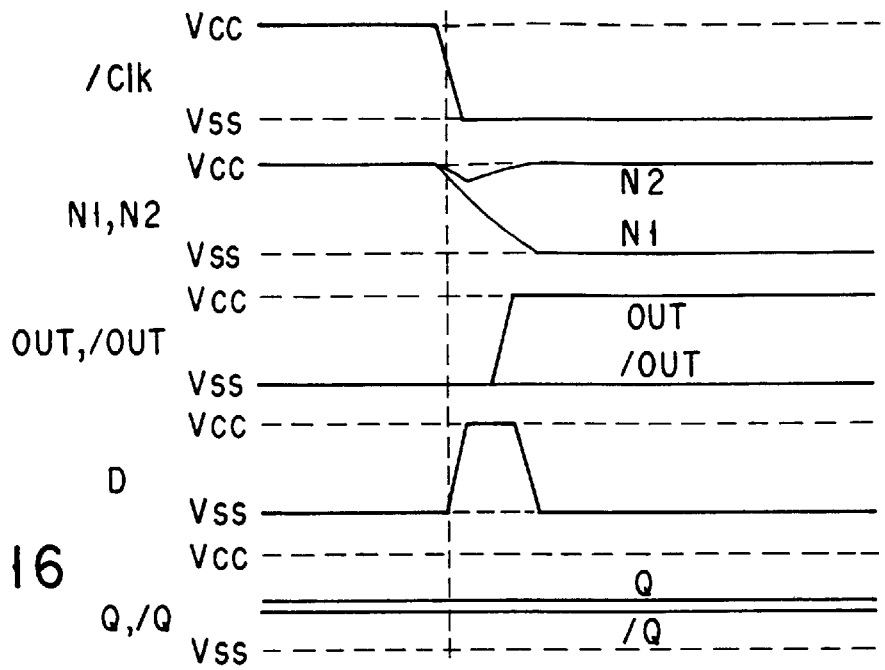
FIG. 16 is a waveform chart showing the operation of the sense amplifier circuit according to the ninth embodiment.

FIG. 16 shows the operation waveform of the ninth embodiment. In a standby state in which the clock signal /Clk="H", both the output terminals Out and /Out are at "L", an output from the NOR gate G2 is at "L", a gate terminal D between the nMOS transistors MXA and MXB is at "L", and thus the nMOS transistors MXA and MXB are kept off. If the clock signal /Clk changes to "L", an output from the NOR gate G2 changes the gate terminal D to "H" to turn on the MOS transistors MXA and MXB, thereby activating the first amplifier 1.

After an output is determined, one of the output terminals Out and /Out changes to "H", an output from the OR gate GI changes to "H", and an output from the NOR gate G2 changes to "L" again to turn off both the nMOS transistors MXA and MXB. As a result, a current flowing through the first amplifier 1 is interrupted upon determination of data.

According to the ninth embodiment, the number of transistors inserted in the current path within the first amplifier 1 can be minimized while a circuit activation function and a current interruption function upon determination of data are realized.

Figure 17:
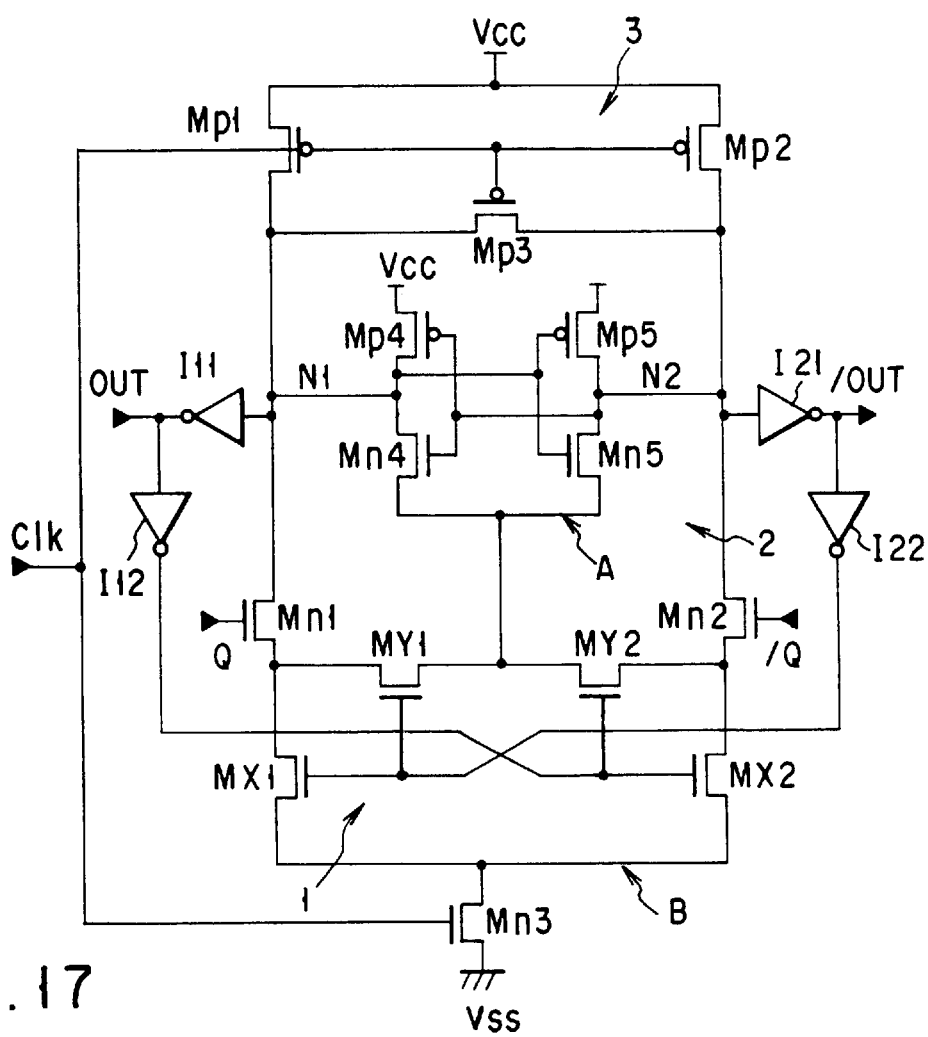
FIG. 17 is a circuit diagram showing a sense amplifier circuit according to the 10th embodiment of the present invention.

FIG. 17 shows a sense amplifier circuit according to the 10th embodiment as a modification of the embodiment in FIG. 12. In the 10th embodiment, the activation nMOS transistor Mn6 of the second amplifier 2 in FIG. 12 is divided into two transistors MY1 and MY2. The two transistors MY1 and MY2 are inserted between a common source for nMOS transistors Mn4 and Mn5 and the sources of nMOS transistors Mn1 and Mn2. The gates of the nMOS transistors MY1 and MY2 are controlled by potentials prepared by inverting the potentials of output terminals Out and /Out by inverters I12 and I22.

The nMOS transistors MY1 and MY2 in the 10th embodiment serve to activate a second amplifier 2, and in addition operate to reliably delay the operation start timing of the second amplifier 2 from that of a first amplifier 1, similar to the second embodiment. More specifically, the first amplifier 1 starts operating to change the sources of the MOS transistors Mn1 and Mn2 to "L". Charges stored in the parasitic capacitances of the MOS transistors MY1 and MY2 flow to the ground terminal VSS to change a node A to "L", thereby operating the second latch amplifier 2.

In the 10th embodiment, the gate potentials of the MOS transistors MY1, MY2, MX1, and MX2 are fixed at "H" in a standby state. Accordingly, the sources of a pair of differential nMOS transistors Mn1 and Mn2 are short-circuited by the nMOS transistors MY1 and MY2 and kept at the same potential. This contributes to an increase in operation margin. For example, in the embodiment of FIG. 12, three MOS transistors are series-connected in each of the two current paths within the first amplifier 1. If the current drive ability changes due to variations in thresholds of these transistors or the like, the operation margin of the amplifier decreases. To the contrary, in the 10th embodiment, since the sources of the MOS transistors Mn1 and Mn2 are short-circuited in a standby state, only two transistors Mp4 and Mn1 and two transistors Mp5 and Mn2 are respectively inserted in two current paths from the sources within the first amplifier 1. The number of transistors whose operation margins reflect variations in threshold can be decreased to suppress degradation of performance caused by process variations.

Figure 18:
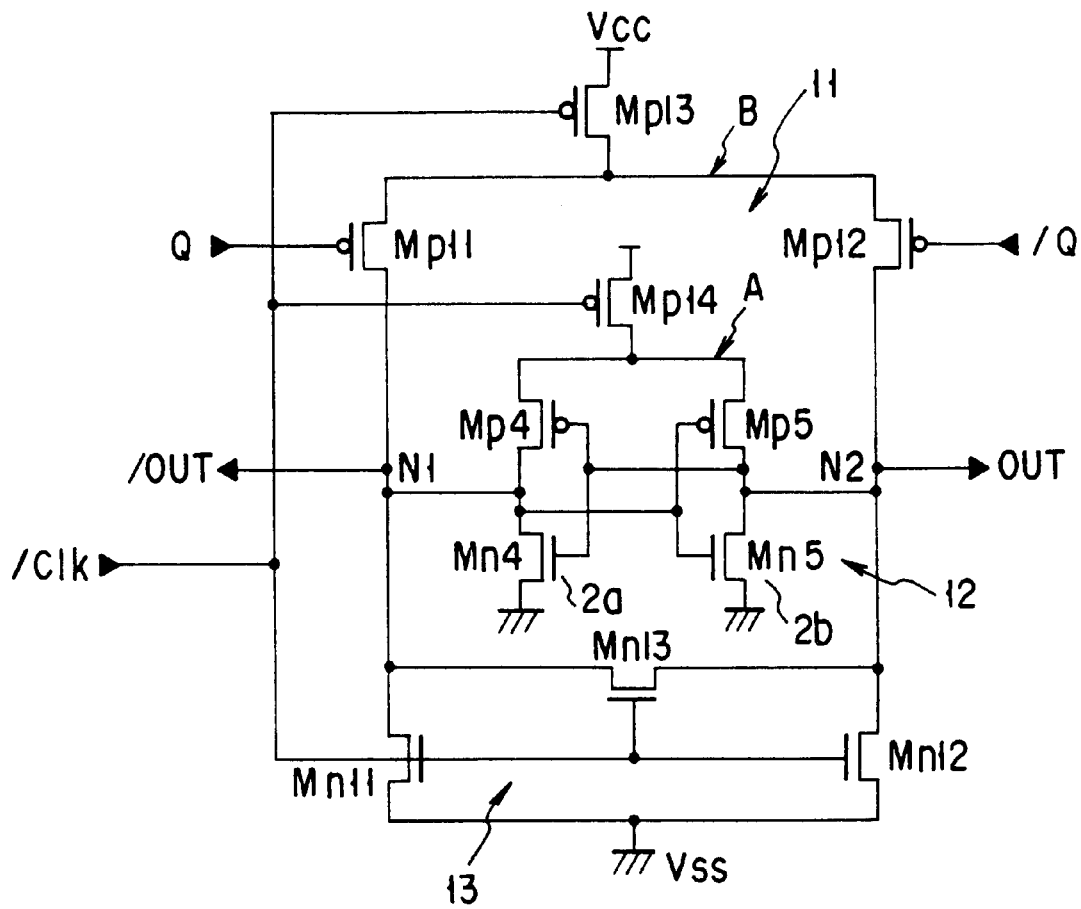
FIG. 18 is a circuit diagram showing a sense amplifier circuit according to the 11th embodiment of the present invention.

In any of the above embodiments, the input/output nodes N1 and N2 of the second amplifier 2 are precharged to VCC in a standby state but they may be precharged to VSS. FIG. 18 shows a sense amplifier circuit for VSS precharging according to the 11th embodiment of the present invention in correspondence with FIG. 1. In the 11th embodiment, a precharge circuit 13 using nMOS transistors Mn11, Mn12, and Mn13 is located on the ground terminal VSS side instead of the precharge circuit 3 using the PMOS transistors Mp1, Mp2, and Mp3 in FIG. 1. The nMOS transistors Mn11 and Mn12 with sources commonly connected to VSS are controlled by the clock signal /Clk to precharge nodes N1 and N2 to VSS. The nMOS transistor Mn13 is used for short-circuiting.

A first amplifier 11 using a pair of driver PMOS transistors Mp11 and Mp12 is formed on the VCC side in correspondence with the first amplifier 1 using a pair of driver nMOS transistors Mn1 and Mn2 in FIG. 1. The activation circuit of the first amplifier 11 is constituted by a pMOS transistor Mp13. A second amplifier 12 has the same basic arrangement as that of the second amplifier 2 in FIG. 1 except that the activation circuit is constituted by a pMOS transistor Mp14 formed between the common source of a pair of pMOS transistors Mp4 and Mp5, node A and the power supply terminal VCC.

Figure 19:
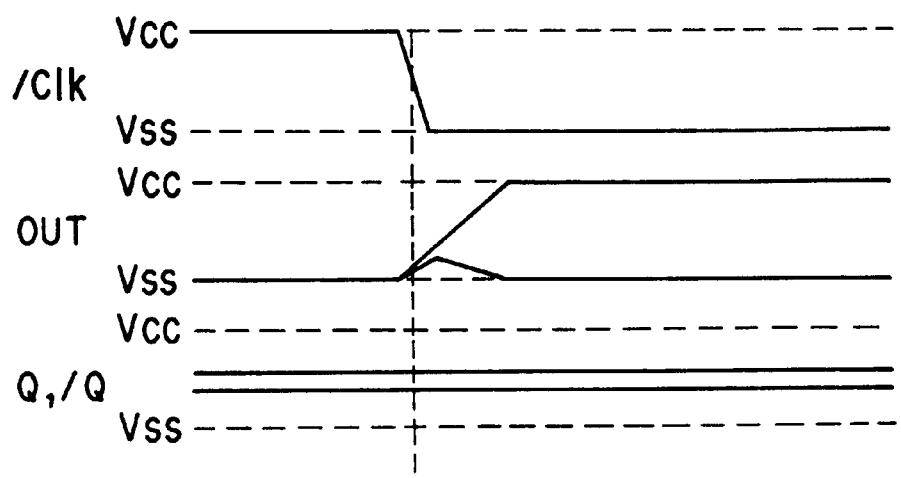
FIG. 19 is a waveform chart showing the operation of the sense amplifier circuit according to the 11th embodiment.

FIG. 19 shows the operation waveform of the circuit according to the 11th embodiment. In a standby state in which the clock signal /Clk="H", the output terminals Out and /Out are precharged to VSS. The clock signal /Clk changes to "L" to simultaneously activate the first and second amplifiers 11 and 12. When the potential difference between input terminals Q and /Q produces a difference in conductivity between a pair of transistors Mp11 and Mp12 of the first amplifier 11, the potential of one of the input/output nodes N1 and N2 rises faster than the potential of the other, and the difference is amplified by the second amplifier 12 to change one of the output terminals Out and /Out to VSS and the other to VCC.

Also in the 11th embodiment, basically the same sense operation as that in the embodiment of FIG. 1 can be performed. The 11th embodiment is particularly suitable for an application of sensing a difference in potential drop from VCC between the input nodes Q the activation timings of the two amplifiers differed or to insert the current interruption MOS transistors, as shown in FIG. 6 and subsequent views. The embodiment in FIG. 18 can be similarly modified.

Figure 20:
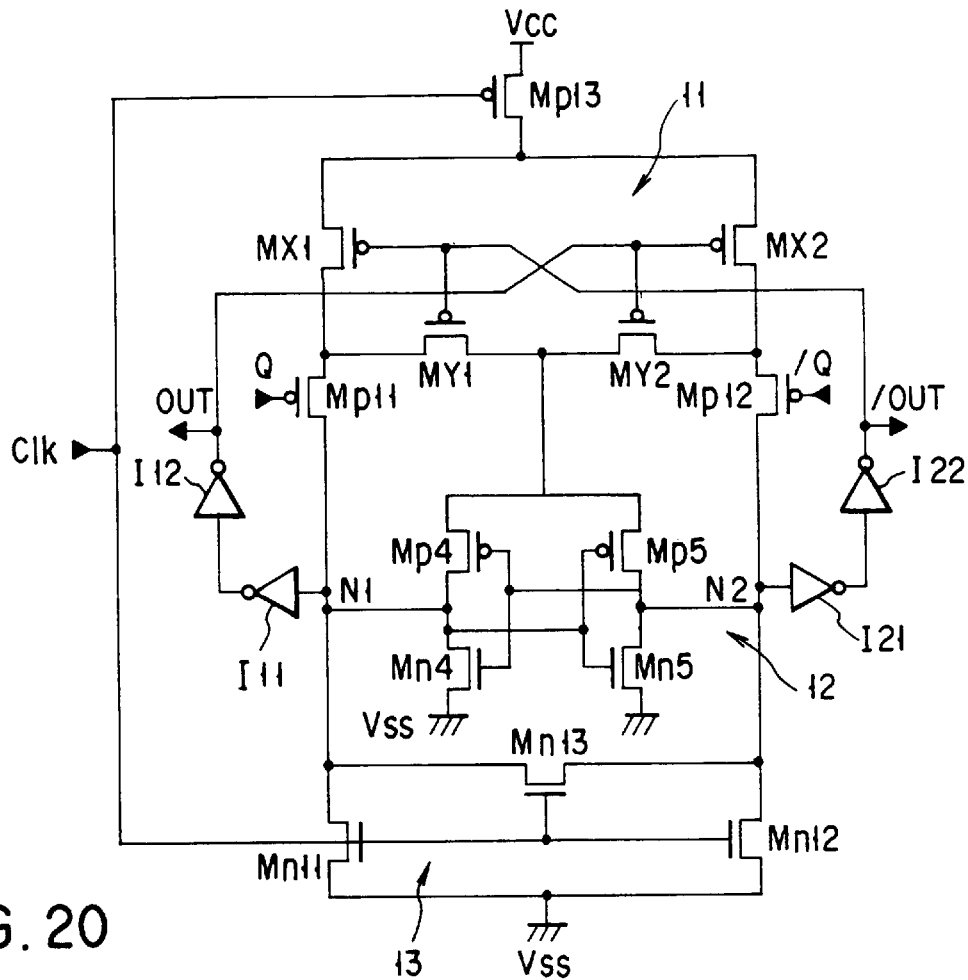
FIG. 20 is a circuit diagram showing a sense amplifier circuit according to the 12th embodiment of the present invention.

FIG. 20 shows a sense amplifier circuit according to the 12th embodiment in correspondence with FIG. 17 as a representative of the modifications. In FIG. 20, the same reference symbols MX1, MX2, MY1, and MY2 as in FIG. 17 denote pMOS transistors.

Although a detailed description of operation will be omitted, nodes N1 and N2 are precharged to VSS in a standby state in the 12th embodiment. First and second amplifiers 11 and 12 operate to change one of output terminals Out and /Out from "L" to "HH" in accordance with the potential relationship of input nodes Q and /Q.

In FIG. 20, the potentials of the output terminals Out and /Out are extracted from the input/output nodes N1 and N2 via two inverters, but an output terminal may be extracted from nodes between two inverters, similar to the embodiment in FIG. 17.

Figure 21:
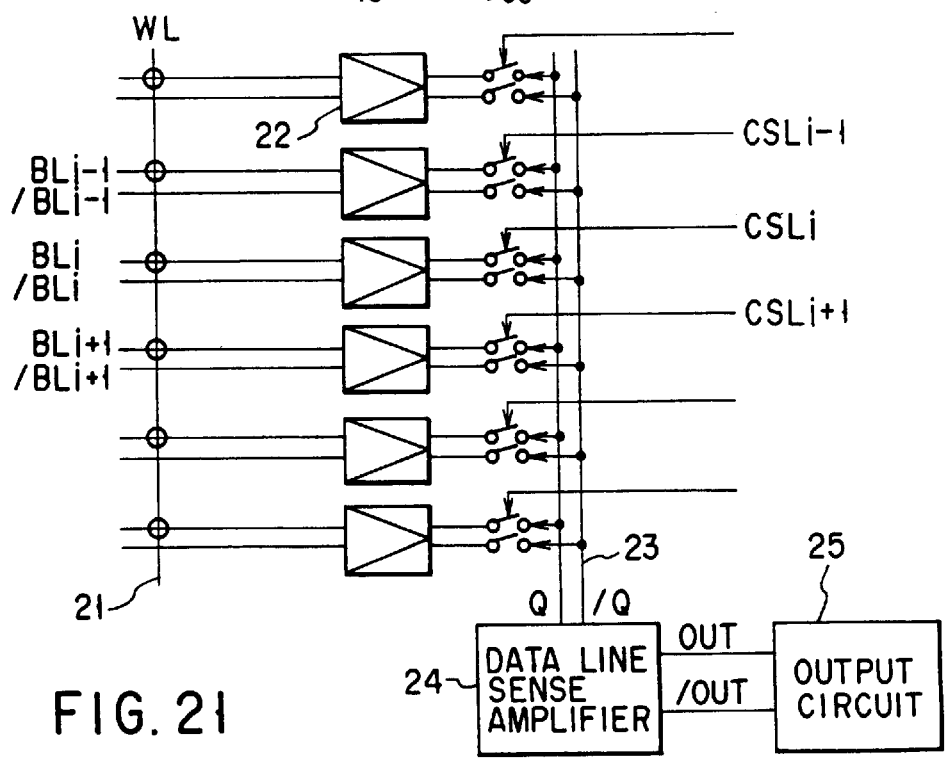
FIG. 21 is a diagram showing a preferred application example of the sense amplifier circuit according to the present invention.
Figure 22:
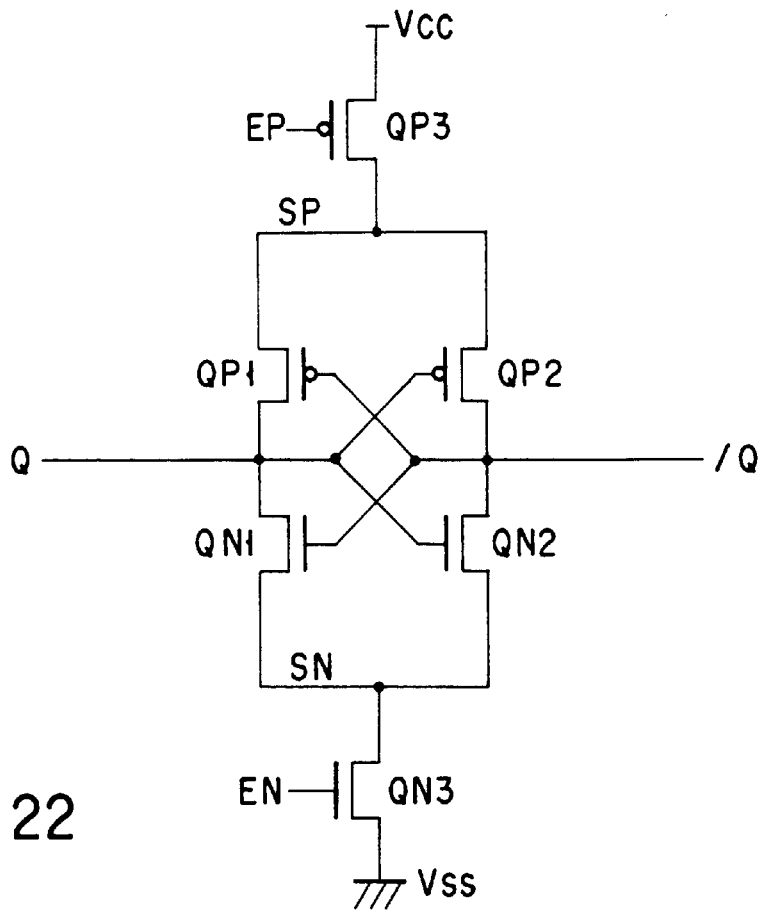
FIG. 22 is a circuit diagram showing an example of a conventional sense amplifier circuit.
Figure 23:
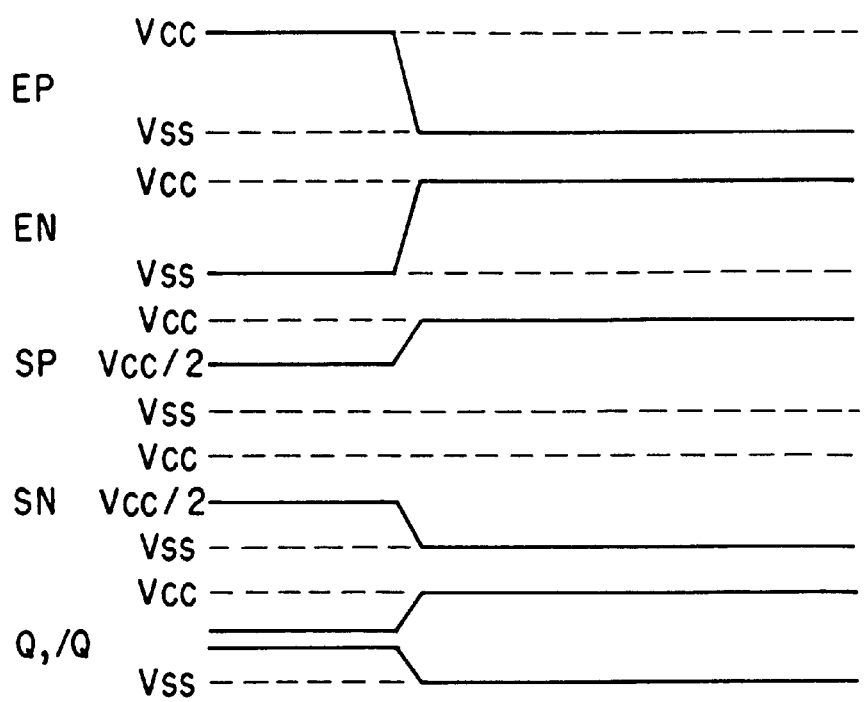
FIG. 23 is a waveform chart showing the operation of the sense amplifier circuit in FIG. 22.

FIG. 21 shows an application example to a DRAM as a preferred application example of the sense amplifier circuit according to the present invention. As shown in FIG. 21, the DRAM comprises a memory cell array 21 on which dynamic memory cells are formed at the intersections of many pairs of bit lines BL and /BL and a word line WL. Each pair of bit lines BL and /BL has a bit line sense amplifier 22. Data read out to the bit line sense amplifier 22 is selected by a column selection line CSL and extracted to data lines 23. The data lines 23 have a data line sense amplifier 24, and an output from the data line sense amplifier 24 is extracted out of the chip via a data output circuit 25. The sense amplifier circuit according to the present invention is preferably used as the data line sense amplifier 24 of the DRAM.

As has been described above, in the sense amplifier circuit according to the present invention, the output of the first differential amplifier is directly connected to the input/output node of the second latch amplifier, and the first and second amplifiers are activated at almost the same time under clock control to sense a small potential difference. As a result, sense operation can be performed at high speeds by one change in clock signal. The control clock signal need not be complementary clocks and can be simplified.

In the sense amplifier circuit of the present invention, the first and second amplifiers share the load to further simplify the circuit arrangement. In the present invention, the activation timings of the first and second amplifiers can be slightly differed to prevent malfunction caused by variations in thresholds of MOS transistors in use and to obtain an output reliably reflecting a small potential difference between the input terminals.

Moreover, switching elements which are controlled by determined output potentials to automatically interrupt current paths are inserted on the current paths between the input/output nodes of the second amplifier and the reference potential terminal of the first amplifier. This can prevent a wasteful current from flowing through the first amplifier upon determination of an output, thereby effectively reducing the power consumption of the sense amplifier circuit.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A sense amplifier circuit comprising:
   first and second input terminals;
   a voltage source terminal connected to a voltage source;
   a reference potential terminal connected to a reference potential;
   a clock signal terminal for receiving a clock signal;
   a first amplifier electrically connected to the first and second input terminals and the voltage source terminal, for sensing a potential difference between the input terminals and outputting differential outputs;
   a first activation circuit connected to the clock signal terminal, the first amplifier, and the reference voltage terminal, for activating the first amplifier in accordance with the clock signal;
   a second amplifier of latch-type connected to the voltage source terminal, having first and second input/output nodes respectively connected to the differential outputs from the first amplifier, for amplifying the differential output from said first amplifier and latching the amplified differential outputs;
   first and second output terminals respectively connected to the first and second input/output nodes, for extracting output signals therefrom;
   a second activation circuit connected to the second amplifier, for activating the second amplifier in association with said first amplifier; and
   switching elements arranged on paths of current flowing from the input/out nodes to the reference potential terminal through said first amplifier, for interrupting the current flow on the paths.

2. The circuit according to claim 1, further comprising an OR gate receiving signals from said first and second output terminals and a NOR gate receiving an output signal from said OR gate and said clock signal, wherein both of said first activation circuit and said switching elements are comprised of the same pair of MOS transistors, and gates of said pair of MOS transistors are connected to an output of said NOR gate.

3. The circuit according to claim 1,
   wherein each of said switching elements comprises a switching MOS transistor, said circuit further comprising buffer circuits each having an input terminal connected to one of said two output terminals and an output terminal connected to a gate of the switching MOS transistor.

4. The circuit according to claim 1, wherein:
   said first activation circuit comprises first and second activating MOS transistors, drains of said first and second activating MOS transistors being connected to said first amplifier and said reference potential terminal, said first and second switching MOS transistors being respectively inserted between said reference potential terminal and said first and second activating MOS transistors to be connected in series thereto.

5. The circuit according to claim 1, wherein said switching elements each comprise a switching MOS transistor having a gate connected to a corresponding one of said input/output terminals, said switching MOS transistor inserted between the other of said input/output terminals and said second activation circuit.

6. The circuit according to claim 5, further comprising a clock signal terminal receiving a clock signal and a precharge circuit for setting the two input/output nodes at a predetermined potential prior to activation of said first and second amplifiers in accordance with said clock signal.

7. A circuit according to claim 5, wherein said second amplifier comprises a load used in common with said first amplifiers.

8. A circuit according to claim 5, further comprising one or more delay elements connected to said second activation circuit and said first activation circuit, for turning said second activation circuit on with a delay with respect to said first activation circuit.

9. A sense amplifier circuit comprising:

first and second input terminals;

a voltage source terminal connected to a voltage source;

a reference potential terminal connected to a reference potential;

a clock signal terminal receiving a clock signal;

a first amplifier having first and second current paths respectively connected to the first and second input terminals, the voltage source terminal and the reference potential terminal, for sensing a potential difference between said two input terminals and for outputting differential outputs;

a first activation circuit connected to the clock signal terminal and the first amplifier, for activating the first amplifier in accordance with the clock signal;

a second amplifier of latch-type, having first and second input/output nodes respectively connected to the voltage source terminal, the reference potential terminal, and the first and second current paths, for amplifying differential outputs from said first amplifier and latching the amplified differential outputs;

first and second output terminals respectively connected to the first and second input/output nodes of the second amplifier, for extracting output signals;

first and second buffer circuits respectively connected to said first and second output terminals;

a second activation circuit comprising first and second MOS transistors connected in series to each other, wherein the ends of the MOS transistors respectively are connected to the first and second current paths, the node between the MOS transistors are connected to said second amplifier, gates of the first and second MOS amplifiers respectively are connected to the second and first buffer circuits;

switching elements comprising first and second MOS transistors arranged on the first and second current paths, the gates of which are respectively connected to the second and first buffer circuits; and a precharge circuit connected to the voltage source terminal and the first and second input/output nodes, for setting the two input/output nodes at a predetermined potential prior to activation of said first and second amplifiers in accordance with the clock signal.

10. The circuit according to claim 9, wherein:

said first amplifier comprises:
a first activation node and
a first channel having first and second drive MOS transistors having sources commonly connected to said first activation node and having drains respectively connected to the two input/output nodes, said first activation circuit comprises an activating MOS transistor being arranged and connected between said first activation node and the reference voltage, and having a gate connected to said clock signal terminal, said second amplifier comprises:
a second activation node;
a second channel having first and second MOS transistors which have sources being connected in common to said second activation node, drains being connected to said input/output nodes, and gates being connected to said second and first input/output nodes, respectively; and
a third channel having third and fourth MOS transistors which have sources being connected in common to said voltage source terminal, drains being connected to said two input/output nodes, and gates being connected to said second and first input/output nodes, respectively, and the third and fourth MOS transistors of the third channel of said second amplifier are used as the load MOS transistors for said first amplifier.

11. A circuit according to claim 10, wherein:

said precharge circuit are connected to said voltage source terminal and said first and second input/output nodes, said precharge circuit comprises first and second precharge MOS transistors the gates of which are connected in common to said clock signal terminal, and a short-circuiting MOS transistor are inserted between the first and second current paths for short-circuiting the first and second current paths, the gate of which is connected to said clock signal terminal.

12. A sense amplifier circuit comprising:

first and second input terminals;

a voltage source terminal connected to a voltage source;

a reference potential terminal connected to a reference potential;

a clock signal terminal for receiving a clock signal;

a first amplifier electrically connected to the input terminals and the voltage source terminal, for sensing a potential difference between the input terminals and outputting differential outputs;

a first activation circuit connected to the clock signal terminal, the first amplifier, and the reference voltage terminal for activating the first amplifier in accordance with the clock signal;

a second amplifier of latch-type connected to the voltage source terminal, having first and second input/output nodes respectively connected to the differential outputs from the first amplifier, for amplifying the differential outputs from said first amplifier and latching the amplified differential outputs;

first and second output terminals respectively connected to the first and second input/output nodes of the second amplifier, for extracting output signals therefrom; and a second activation circuit connected to the clock signal terminal and the second amplifier, for activating the second amplifier in accordance with the clock signal, wherein said first activation circuit has a first activation node, and said second activation circuit has a second activation node, said first activation circuit connects the first activation node to the reference potential when it is activated, and said second activation circuit connects the second activation node to the reference potential via the first activation node connected to the reference potential when said first activation circuit is turned on.

13. A sense amplifier circuit comprising:

first and second input terminals;

a voltage source terminal connected to a voltage source;

a reference potential terminal connected to a reference potential;

a clock signal terminal for receiving a clock signal;

a first amplifier electrically connected to the input terminals and the voltage source terminal, for sensing a potential difference between the input terminals and outputting differential outputs;

a first activation circuit connected to the clock signal terminal, the first amplifier, and the reference voltage terminal for activating the first amplifier in accordance with the clock signal;

a second amplifier of latch-type connected to the voltage source terminal, having first and second input/output nodes respectively connected to the differential outputs from the first amplifier, for amplifying the differential outputs from said first amplifier and latching the amplified differential outputs;

first and second output terminals respectively connected to the first and second input/output nodes of the second amplifier, for extracting output signals therefrom;

a second activation circuit connected to the clock signal terminal and the second amplifier, for activating the second amplifier in accordance with the clock signal; and one or more delay elements inserted between said second activation circuit and said clock signal terminal, for turning said second activation circuit on with a delay in conjunction with said first activation circuit.

14. A sense amplifier circuit comprising:

first and second input terminals;

a voltage source terminal connected to a voltage source;

a reference potential terminal connected to a reference potential;

a clock signal terminal for receiving a clock signal;

a first amplifier electrically connected to the input terminals and the voltage source terminal, for sensing a potential difference between the input terminals and outputting differential outputs;

a first activation circuit connected to the clock signal terminal, the first amplifier, and the reference voltage terminal for activating the first amplifier in accordance with the clock signal;

a second amplifier of latch-type connected to the voltage source terminal, having first and second input/output nodes respectively connected to the differential outputs from the first amplifier, for amplifying the differential outputs from said first amplifier and latching the amplified differential outputs;

first and second output terminals respectively connected to the first and second input/output nodes of the second amplifier, for extracting output signals therefrom;

a second activation circuit connected to the clock signal terminal and the second amplifier, for activating the second amplifier in accordance with the clock signal, wherein:

said first amplifier comprises:
a first activation node; and
a first channel having first and second driver MOS transistors having sources connected in common to said first activation node, and having drains respectively connected to the first and second input/output nodes, said first activation circuit comprises an activating MOS transistor being inserted between said first activation node and the reference voltage terminal, and having a gate connected to said clock signal terminal, said second amplifier comprises:
a second activation node;
a second channel having third and fourth MOS transistors which have sources being connected in common to said second activation node, drains being connected to said first and second input/output nodes, and gates being connected to said second and first input/output nodes, respectively; and
a third channel having fifth and sixth MOS transistors which have sources being connected in common to said voltage source terminal, drains being connected to said first and second input/output nodes, and gates being connected to said second and first input/output nodes, respectively, said second activation circuit comprises an activation MOS transistor being arranged and connected between said second activation node and the reference voltage terminal, and having a gate connected to said clock signal terminal, and the fifth and sixth MOS transistors of the third channel in said second amplifier are used as the load MOS transistors for said first amplifier.

* * * * *